(12) United States Patent
Park et al.

(10) Patent No.: US 8,981,824 B2
(45) Date of Patent: Mar. 17, 2015

(54) PHASE-LOCKED LOOP, METHOD OF OPERATING THE SAME, AND DEVICES HAVING THE SAME

(71) Applicant: Samsung Electronics Co., Ltd., Suwon-si (KR)

(72) Inventors: Jae Jin Park, Hwaseong-si (KR); Tae Kwang Jang, Hwaseong-si (KR); Jenlung Liu, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/201,285

(22) Filed: Mar. 7, 2014

(65) Prior Publication Data

US 2014/0266355 A1 Sep. 18, 2014

(30) Foreign Application Priority Data

Mar. 13, 2013 (KR) ........................ 10-2013-0026725

(51) Int. Cl.
*H03L 7/06* (2006.01)
*H03L 7/10* (2006.01)

(52) U.S. Cl.
CPC ........................................ *H03L 7/10* (2013.01)
USPC .......................................... 327/156; 327/147

(58) Field of Classification Search
None
See application file for complete search history.

(56) References Cited

U.S. PATENT DOCUMENTS

| | | | | |
|---|---|---|---|---|
| 6,631,144 | B1 * | 10/2003 | Johansen | 370/516 |
| 6,757,349 | B1 * | 6/2004 | Katayama et al. | 375/376 |
| 7,046,098 | B2 | 5/2006 | Staszewski | |
| 7,116,145 | B2 * | 10/2006 | Kim et al. | 327/156 |
| 7,209,009 | B2 | 4/2007 | Steinbach et al. | |
| 7,580,497 | B2 * | 8/2009 | Wang et al. | 375/374 |
| 7,592,847 | B2 | 9/2009 | Liu et al. | |
| 7,620,126 | B2 * | 11/2009 | Boerstler et al. | 375/327 |
| 7,719,329 | B1 * | 5/2010 | Smith et al. | 327/157 |
| 7,759,992 | B2 * | 7/2010 | Ibuka | 327/158 |
| 7,772,900 | B2 | 8/2010 | Ainspan et al. | |
| 7,791,417 | B2 | 9/2010 | Wang et al. | |
| 7,920,081 | B2 | 4/2011 | Waheed et al. | |
| 7,999,586 | B2 | 8/2011 | Lee et al. | |
| 8,031,008 | B2 | 10/2011 | Wang et al. | |
| 8,154,350 | B2 | 4/2012 | Faison | |
| 8,203,369 | B2 | 6/2012 | van de Beek | |
| 8,634,510 | B2 * | 1/2014 | Kong et al. | 375/359 |
| 2007/0071155 | A1 * | 3/2007 | Boerstler et al. | 375/376 |
| 2008/0231324 | A1 * | 9/2008 | Liu et al. | 327/12 |
| 2011/0156783 | A1 | 6/2011 | Pavlovic et al. | |
| 2012/0038400 | A1 | 2/2012 | Talaga, Jr. | |
| 2012/0127133 | A1 * | 5/2012 | Frank | 345/204 |
| 2012/0161834 | A1 | 6/2012 | Lee et al. | |

* cited by examiner

*Primary Examiner* — Cassandra Cox
(74) *Attorney, Agent, or Firm* — Sughrue Mion, PLLC

(57) ABSTRACT

A method of operating a phase-locked loop (PLL) such as an all-digital PLL includes operations of comparing a reference clock signal with a feedback signal of the PLL and outputting a comparison signal according to a result of the comparison, and detecting whether the PLL is in a lock state by using a number of times the comparison signal is toggled.

18 Claims, 21 Drawing Sheets

PHASE-LOCKED LOOP, METHOD OF OPERATING THE SAME, AND DEVICES HAVING THE SAME

CROSS-REFERENCE TO RELATED APPLICATIONS

This application claims priority under from Korean Patent Application No. 10-2013-0026725 filed on Mar. 13, 2013, the disclosure of which is incorporated herein in its entirety by reference.

BACKGROUND

Apparatuses and methods consistent with example embodiments relate to a phase-locked loop (PLL) such as an all-digital PLL (ADPLL) capable of detecting whether the ADPLL is locked by using the number of toggling times of a comparison signal output by a bangbang phase frequency detector (BBPFD), a method of operating the PLL, and devices including the PLL.

A PLL is a control circuit that generates an output clock detection signal having a phase related to a phase of an input clock detection signal. The PLL is widely used in wireless communication devices, computers and other electronic devices.

SUMMARY

According to an aspect of an exemplary embodiment, there is provided a method of operating a phase-locked loop (PLL), the method including: comparing a reference clock signal with a feedback signal of the ADPLL, and outputting a comparison signal according to a result of the comparison; and detecting whether the PLL is in a lock state according to a number of times the comparison signal is toggled.

The detecting may include comparing the number of times the comparison signal is toggled with a reference number of times and detecting whether the PLL is in the lock state according to the result of the comparison.

The detecting may further include determining a number of times the comparison signal is toggled by counting a number of times rising edges or falling edges of the comparison signal.

The number of times the rising edges or the falling edges of the comparison signal may be counted after an auto frequency control mode is ended.

The method may further include outputting a lock signal according to a result of the detecting whether the PLL is in the lock state.

The determining the number of times the PLL is toggled may include counting the number of the rising edges or the falling edges of the comparison signal based on the lock signal when the PLL is in an un-lock state.

The method may further include controlling a closed-loop bandwidth of the PLL based on the lock signal.

The method may further include: monitoring whether a mode conversion is needed, based on a control code for controlling a digitally control oscillator included in the ADPLL in a normal mode; and converting the normal mode into an automatic frequency control (AFC) mode according to a result of the monitoring.

The control code may be a code for controlling a total capacitance of a capacitor array associated with the closed-loop bandwidth of the ADPLL.

The monitoring may include monitoring whether all of the capacitors included in the capacitor array are turned on or off, based on the control code.

The monitoring may include: determining a capacitor utilization rate associated with the total capacitance, based on the control code; and comparing the determined capacitor utilization rate with each of a plurality of reference values and monitoring whether the mode conversion is needed, according to a result of the comparison.

The reference values may include an upper limit reference value and a lower limit reference value.

The converting the normal mode into the AFC mode may include converting the normal mode into the AFC mode when the capacitor utilization rate is greater than the upper limit reference value or is smaller than the lower limit reference values.

The method may further include: outputting a monitoring result signal according to a result of the monitoring; and synchronizing the monitoring result signal with the feedback signal of the PLL. The converting the normal mode into the AFC mode may include converting the normal mode into the AFC mode based on a synchronized monitoring result signal corresponding to a result of the synchronizing.

According to an aspect of another exemplary embodiment, there is provided an ADPLL including: a bangbang phase-frequency detector that compares a reference clock signal with a feedback signal of the PLL and outputs a comparison signal according to a result of the comparison; and a lock detector that detects whether the PLL is locked according to a number of times the comparison signal is toggled.

The lock detector may include: a counter circuit that determines the number of times the comparison signal is toggled; and a detection circuit that detects whether the PLL is locked according to the number of times the comparison signal is toggled.

The number of times the comparison signal is toggled may be a number of rising edges or falling edges of the comparison signal.

The PLL may further include a monitor circuit that monitors whether a mode conversion is needed, based on control codes for controlling a digitally control oscillator included in the PLL in a normal mode, and outputs a monitoring result signal for converting the normal mode to an AFC mode, according to a result of the monitoring.

The monitor circuit may perform the monitoring when the lock detector detects that the PLL is locked.

The lock detector may be reset according to the monitoring result signal.

According to an aspect of an exemplary embodiment, there is provided a system on chip (SoC) including: the above PLL; and an application processor that operates in response to a clock signal associated with an output clock signal of the PPL.

According to an aspect of an exemplary embodiment, there is provided another method operating the PLL, the method including: detecting a phase change of a feedback signal of the PLL; adjusting a closed-loop bandwidth of the PLL according to a result of the detecting; and outputting an output clock signal of the PLL based on the adjusted closed-loop bandwidth.

The detecting the phase change of the feedback signal of the PLL may include: generating a plurality of reference signals; setting a search window between a rising edge of an earliest reference and a rising edge of a latest reference signal among the reference signals; and detecting the phase change of the feedback signal of the PLL with respect to the search window.

The adjusting the closed-loop bandwidth of the PLL may include: controlling the feedback signal to have a first closed-loop bandwidth if the phase change is detected outside the search window; and controlling the feedback signal to have a second closed-loop bandwidth, different from the first closed-loop bandwidth, if the phase change is detected within the search window.

The closed-loop bandwidth of the PLL may be adjusted further according to a level of a lock signal which is generated by detecting whether the PLL is in a lock state.

BRIEF DESCRIPTION OF THE DRAWINGS

The above aspects of the present inventive concepts will become apparent and more readily appreciated from the following description of the exemplary embodiments, taken in conjunction with the accompanying drawings, in which.

DETAILED DESCRIPTION OF THE EXEMPLARY EMBODIMENTS

Figure 1:
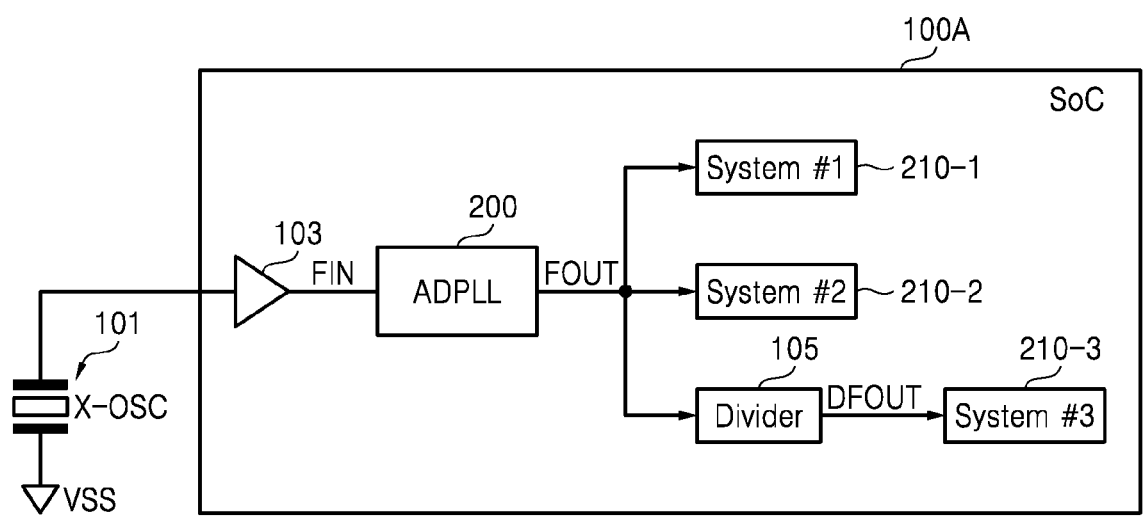
FIG. 1 is a block diagram of a system on chip (SoC) according to an exemplary embodiment, which includes an all-digital phase-locked loop (ADPLL) according to an exemplary embodiment.

The present inventive concept will be described hereinafter with reference to the accompanying drawings, in which exemplary embodiments thereof are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items, and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements and/or components, but do not preclude the presence or addition of one or more other features, regions, integers, steps, operations, elements, components and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a system on chip (SoC) 100A according to an exemplary embodiment of the inventive concept, which includes an all-digital phase-locked loop (ADPLL) 200 according to an exemplary embodiment of the inventive concept. Referring to FIG. 1, the SoC 100A includes a buffer 103, the ADPLL 200, a plurality of systems 210-1 through 210-3 and a divider 105.

The buffer 103 buffers an output signal of a crystal-oscillator 101 implemented on the outside of the SoC 100A, to generate an input clock signal FIN.

The ADPLL 200 may detect a phase change of a feedback signal of the ADPLL 200 by using a search window SW, adjust a closed-loop bandwidth of the ADPLL 200 based on a result of the detection, and generate an output clock signal FOUT according to a result of the adjustment. In other words, the ADPLL 200 may control the closed-loop bandwidth of the ADPLL 200 according to whether a phase of the feedback signal of the ADPLL 200 changes in the search window SW.

Each of the systems 210-1 and 210-2 operates in response to the output clock signal FOUT.

The divider 105 divides the frequency of the output clock signal FOUT by a division factor to generate a frequency-divided output clock signal DFOUT, and outputs the frequency-divided output clock signal DFOUT to the system 210-3.

Each of the systems 210-1 through 210-3 denotes hardware or a circuit that operates by using the output clock signal FOUT or a clock signal related to the output clock signal FOUT. For example, the system 210-1 may be a central processing unit (CPU), a processor, or an application processor (AP), the system 210-2 may be a graphic processing unit (GPU), and the system 210-3 may be a memory device or a memory controller.

Each of the systems 210-1 through 210-3 may be an intellectual property (IP). In this specification, the IP is a function block used in the SoC 100A, and may denote a CPU, a processor, each core of a multi-core processor, a memory device, an universal serial bus (USB), a peripheral component interconnect (PCI), a digital signal processor (DSP), a wired interface, a wireless interface, a controller, embedded software, a codec, a video module (for example, a camera interface, a Joint Photographic Experts Group (JPEG) processor, a video processor, or a mixer), a 3-dimensional (3D) graphic core, an audio system, a driver, or the like. SoC 100A may be a part of AP or a part of mobile AP.

Figure 2:
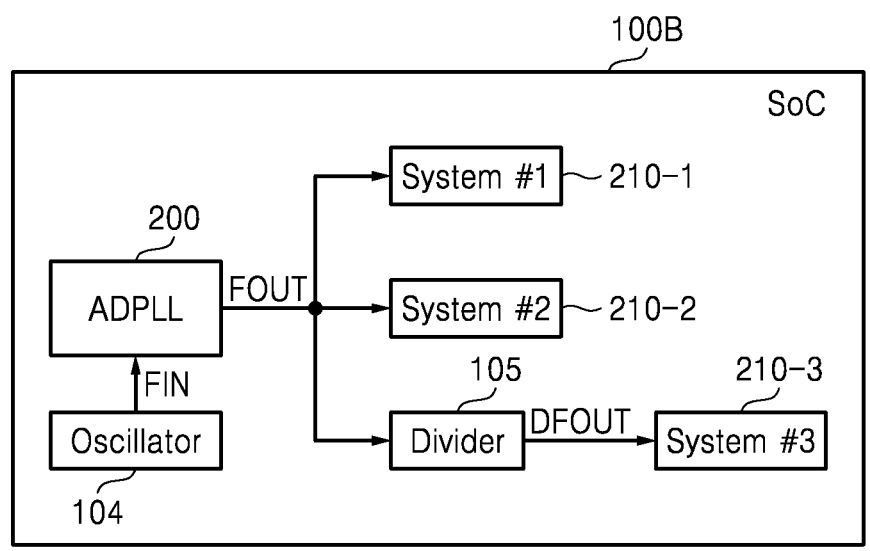
FIG. 2 is a block diagram of an SoC according to another exemplary embodiment, which includes the ADPLL illustrated in FIG. 1.

FIG. 2 is a block diagram of a SoC 100B according to another exemplary embodiment of the inventive concept, which includes the ADPLL 200. Referring to FIGS. 1 and 2, a structure and a function of the SoC 100A of FIG. 1 are substantially the same as those of the SoC 100B of FIG. 2, except that an oscillator 104 generating the output clock signal FIN is implemented inside the SoC 100B.

Figure 3:
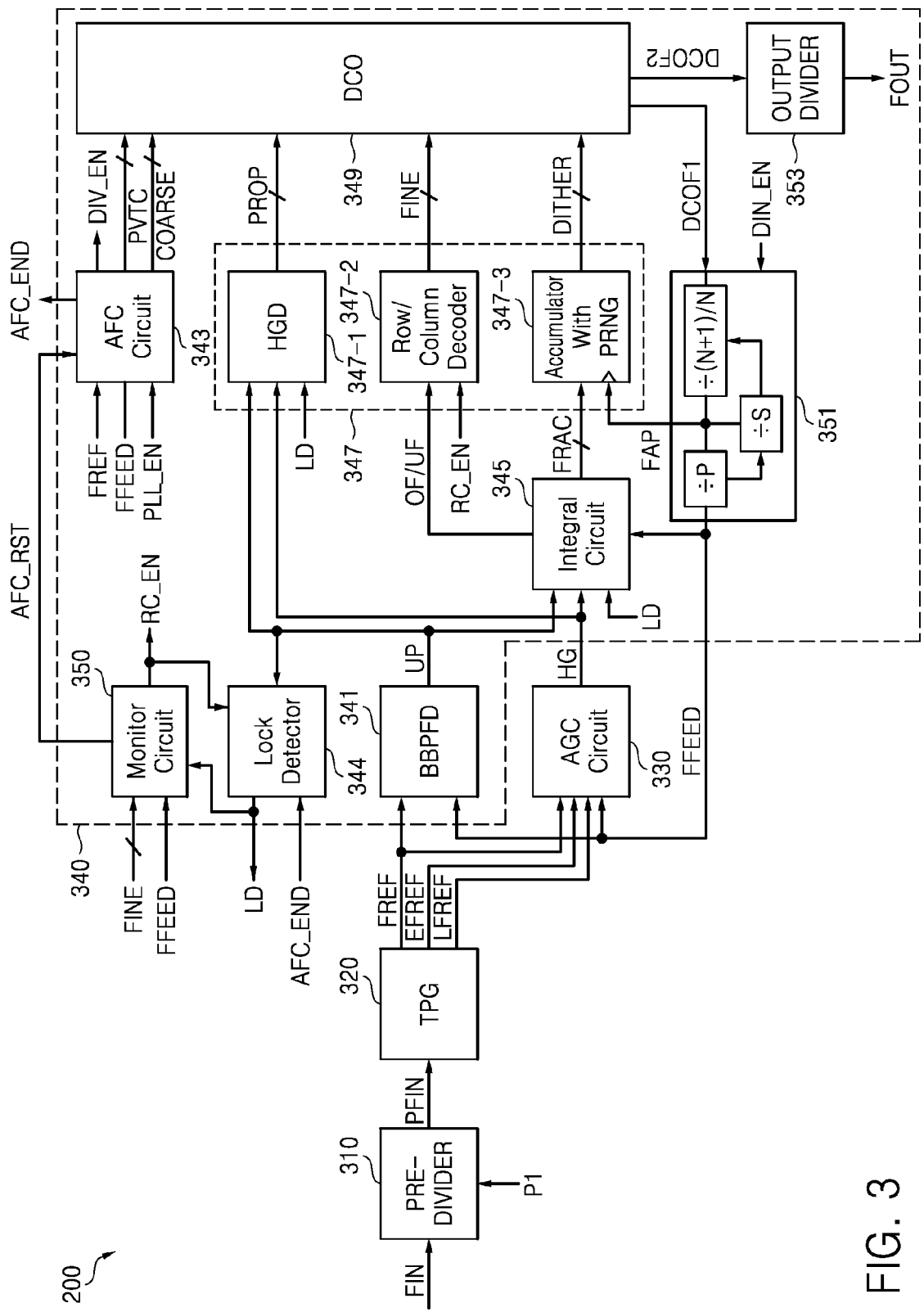
FIG. 3 is a block diagram of the ADPLL of FIG. 1, according to an exemplary embodiment.
Figure 4:
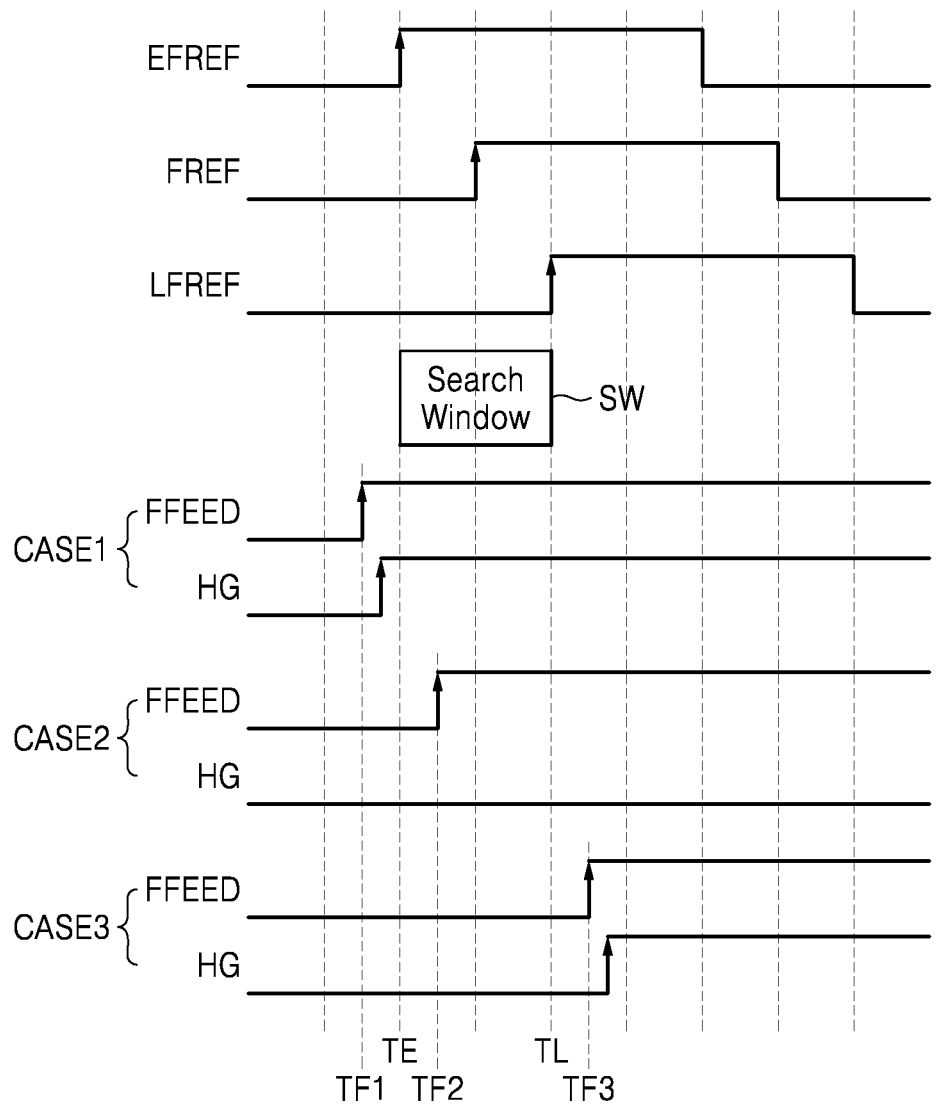
FIG. 4 is waveforms for describing output signals of a three-phase signal generator (TPG) illustrated in FIG. 3 and an operation of an adaptive gain control (AGC) circuit illustrated in FIG. 3, according to an exemplary embodiment.

FIG. 3 is a block diagram of the ADPLL 200, and FIG. 4 illustrates waveforms of output signals of a three-phase signal generator (TPG) 320 illustrated in FIG. 3 and an operation of an adaptive gain control (AGC) circuit 330 illustrated in FIG. 3.

Referring to FIG. 3, the ADPLL 200 includes a pre-divider 310, the TPG 320, the AGC circuit 330 and a closed-loop bandwidth control circuit 340.

The pre-divider 310 divides a frequency of the output clock signal FIN by a division factor P1 to output a divided-by-P1 clock signal PFIN.

As shown in FIG. 4, the TPG 320 may generate three reference clock signals, namely, a reference clock signal FREF, an early reference clock signal EFREF and a left reference clock signal LFREF, having different phases by using the divided-by-P1 clock signal PFIN. For example, the reference clock signal FREF, the early reference clock signal EFREF and the late reference clock signal LFREF may have the same frequency.

According to an exemplary embodiment, the TPG 320 may be replaced with a multi-phase signal generator that generates four or more reference clock signals having different phases. The TPG 320 serves as a reference clock signal generator that generates the reference clock signals REF, EFREF and LFREF.

The AGC circuit 330 serving as a detection circuit may detect a phase change or transition of a feedback signal FFEED of the ADPLL 200 by using the search window SW, and generate a detection signal, for example, a high gain enable signal HG, according to a result of the detection.

As shown in FIG. 4, the search window SW may be defined by a rising edge TE of the early reference clock signal EFREF and a rising edge TL of the late reference clock signal LFREF.

As in a case CASE1, when a phase change point TF1, for example, a rising edge, of the feedback signal FFEED leads a phase change point TE, for example, a rising edge, of the early reference clock signal EFREF, the AGC circuit 330 generates the high gain enable signal HG in a high level. As in a case CASE2, when a phase change point TF2 of the feedback signal FFEED exists in the search window SW, the AGC circuit 330 generates the high gain enable signal HG in a low level.

As in a case CASE3, when a phase change point TF3 of the feedback signal FFEED lags a phase change point TL of the late reference clock signal LFREF, the AGC circuit 330 generates the high gain enable signal HG in a high level.

The closed-loop bandwidth control circuit 340 may control a closed-loop bandwidth of the ADPLL 200 according to the high gain enable signal HG.

For example, as in the case CASE1 or CASE3, when a phase change of the feedback signal FFEED is detected on the outside of the search window SW, namely, when the high gain enable signal HG is activated to a high level, the closed-loop bandwidth control circuit 340 generates a feedback signal FFEED having a first closed-loop bandwidth. However, as in the case CASE2, when a phase change of the feedback signal FFEED is detected inside the search window SW, namely, when the high gain enable signal HG is deactivated to a low level, the closed-loop bandwidth control circuit 340 generates a feedback signal FFEED having a second closed-loop bandwidth.

The first closed-loop bandwidth is greater than the second closed-loop bandwidth.

According to an exemplary embodiment, the closed-loop bandwidth control circuit 340 may control the closed loop bandwidth of the ADPLL 200 in response to the high gain enable signal HG and a lock signal LD.

For example, when the high gain enable signal HG is in a high level and the lock signal LD is in a low level, the closed-loop bandwidth control circuit 340 generates a feedback signal FFEED having a third closed loop bandwidth. On the other hand, when the high gain enable signal HG is in a low level and the lock signal LD is in a high level, the closed-loop bandwidth control circuit 340 generates a feedback signal FFEED having a fourth closed loop bandwidth. The third closed loop bandwidth is greater than the fourth closed loop bandwidth.

The closed-loop bandwidth control circuit 340 may include a bangbang phase frequency detector (BBPFD) 341, an automatic frequency control (AFC) circuit 343, a lock detector 344, an integral circuit 345, a fine control circuit 347, a digitally controlled oscillator (DCO) 349, a monitor circuit 350, a main divider 351 and an output divider 353.

The BBPFD 341 compares a phase and a frequency of the reference clock signal FREF to a phase and a frequency of the feedback signal FFEED, respectively, and outputs a comparison signal UP according to a result of the comparison.

Figure 5:
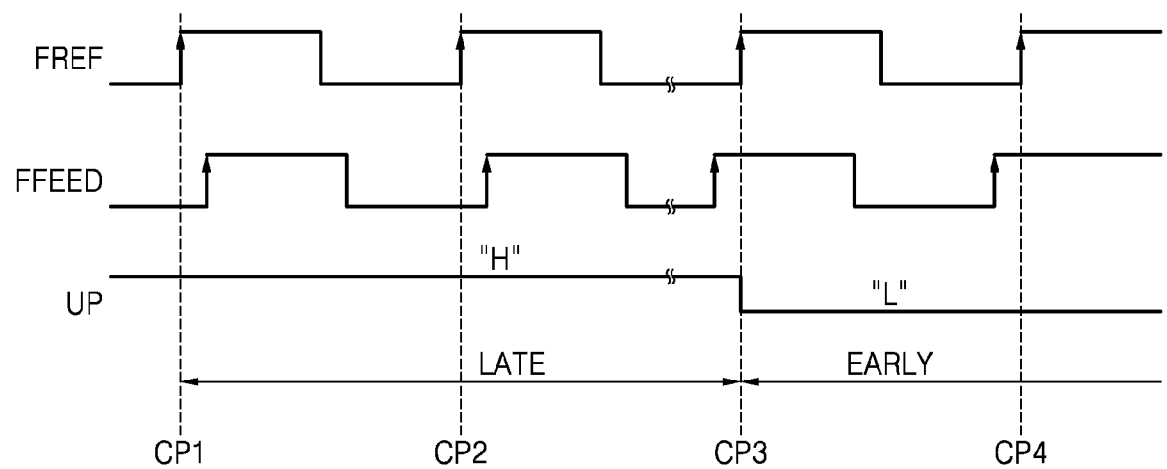
FIG. 5 illustrates waveforms for explaining an operation of a bangbang phase frequency detector (BBPFD) illustrated in FIG. 3, according to an exemplary embodiment.

FIG. 5 illustrates waveforms for describing an operation of the BBPFD 341. In each of comparison points CP1 and CP2, when a phase (or a phase shift point) of the reference clock signal FREF leads a phase (or a phase shift point) of the feedback signal FFEED, the BBPFD 341 outputs the comparison signal UP in a high level to increase the frequency of each of output clock signals DCOF1 and DCOF2 of the DCO 349. For example, in a late state LATE, the BBPFD 341 outputs the comparison signal UP in a high level.

On the other hand, in each of comparison points CP3 and CP4, when a phase (or a phase shift point) of the reference clock signal FREF lags a phase (or a phase shift point) of the feedback signal FFEED, the BBPFD 341 outputs the comparison signal UP in a low level to decrease the frequencies of the output clock signals DCOF1 and DCOF2 of the DCO 349. For example, in an early state EARLY, the BBPFD 341 outputs the comparison signal UP in a low level.

For example, the BBPFD 341 outputs a comparison signal UP maintaining a high level or a low level in an un-lock state. On the other hand, the BBPFD 341 outputs a comparison signal UP toggling between the high level and the low level.

The AFC circuit 343 enabled in response to a PLL enable signal PLL_EN generates a divider enable signal DIV_EN in response to a rising edge of the reference clock signal FREF. Thus, the main divider 351 generates the feedback signal FFEED in response to the divider enable signal DIV_EN.

In an AFC mode, the AFC circuit 343 compares a frequency of the reference clock signal FREF with that of the feedback signal FFEED, and generates a first control code PVTC and a second control code COARSE according to a result of the comparison.

In the AFC mode, circuit blocks 310, 320, 330, 341, 344, 345, 347, 349, 350, 351 and 353 except for the AFC circuit 343 are disabled. Thus, power consumption of the DCO 349 decreases, a resolution of the DCO 349 increases, phase noise of the DCO 349 decreases and a locking time decreases. The locking time denotes the period of time taken for the PDPPL 200 to change from an unlock state to a lock state.

The first control code PVTC corresponds to digital signals for tuning, calibrating, or compensating for a process/voltage/temperature (PVT) variation of the DCO 349. For example, the first control code PVTC controls delay amounts of delay cells associated with the closed-loop bandwidth of the feedback signal FFEED of the ADPLL 200.

The second control code COARSE corresponds to digital signals for controlling a voltage or a current supplied to the DCO 349, in order to tune, calibrate, or compensate for the frequency of each of output signals DCOF1 and DCOF2. For example, the second control code COARSE controls the current amount of a current source associated with the closed-loop bandwidth of the feedback signal FFEED of the ADPLL 200.

According to exemplary embodiments, in the AFC mode, the AFC circuit 343 may generate the first control code PVTC and the second control code COARSE at different timing, or may generate the first control code PVTC and the second control code COARSE at the same time. The number of bits included in the first control code PVTC may differ to the number of bits included in the second control code COARSE.

In the AFC mode, the AFC circuit 343 performs two-step frequency tuning.

In a first step of the two-step frequency tuning, the first control code PVTC is generated at the ACT circuit 343 to control the widest frequency tuning range of the DCO 349, in order to compensate for the PVT variation of the DCO 349. In a second step of the two-step frequency tuning, the second control code COARSE is generated at the ACT circuit 343 to control an intermediate frequency tuning range of the DCO 349.

After the two-step frequency tuning is ended, in a normal mode, precision control codes, namely, third, fourth, fifth control codes PROP, FINE and DITHER, are generated at the fine control circuit 347 to control the smallest frequency tuning range of the DCO 349. Thus, in an early stage of the normal mode, the DCO 349 operates in a frequency that is very close to a target frequency. When the AFC mode is ended, the AFC circuit 343 may output an AFC end signal AFC_END indicating that the AFC mode is ended, FIG. 6 is a flowchart of an operation of the AFC circuit 343 of FIG. 3, and FIG. 7 is a conceptual diagram for explaining an operation of the AFC circuit 343 of FIG. 3.

Figure 6:
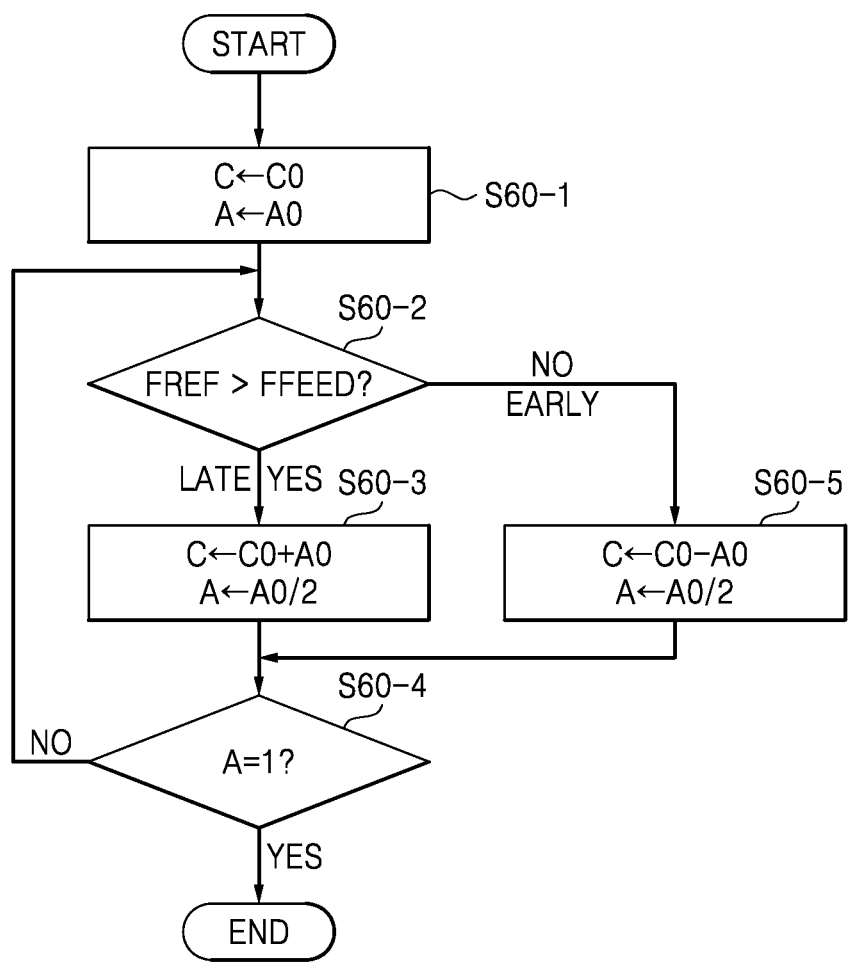
FIG. 6 is a flowchart of an operation of an auto frequency control (AFC) circuit illustrated in FIG. 3, according to an exemplary embodiment.
Figure 7:
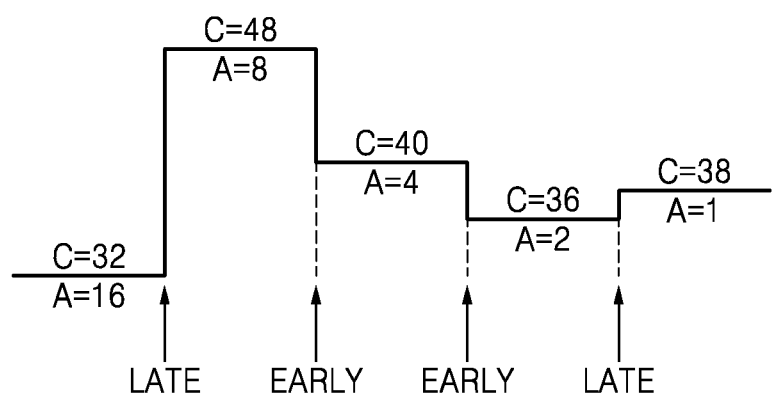
FIG. 7 is a conceptual diagram of an operation of the AFC circuit illustrated in FIG. 3, according to an exemplary embodiment.

A method of determining the bits included in the first control code PVTC and/or the bits included in the second control code COARSE will now be conceptually described by referring to FIGS. 6 and 7. For convenience of explanation, it is assumed that the first control code PVTC and the second control code COARSE are both composed of six (6) bits. However, as described above, the number of bits included in the first control code PVTC may be different from that included in the second control code COARSE.

In operation S60-1, a first initial value C0 (for example, C0=32=6'b100000) is set as a first value C of the first control code PVTC, and a second initial value A0 (for example, A0=16=6'b010000) is set as a second value A of the second control code COARSE.

In operation S60-2, a frequency of the reference clock signal FREF is compared with that of the feedback signal FFEED. When it is determined in operation S60-2 that the frequency of the reference clock signal FREF is higher than that of the feedback signal FFEED, operation S60-3 may be performed in the LATE state.

In other words, a sum of the first initial value C0 (=32=6'b100000) and the second initial value A0 (=16=6'b010000) is set as the first value C (=48=6'b110000), a value corresponding to a half of the second initial value A0 (=16=6'b010000) is set as the second value A (=8=6'b001000), in operation S60-3.

Since the second value (A=8=6'b001000) is not 1, that is, 6'b000001, in operation S60-4, operation S60-2 is performed. When it is determined in operation S60-2 that the frequency of the reference clock signal FREF is lower than the frequency of the feedback signal FFEED, operation S60-5 may be performed in the EARLY state.

In operation S60-5, a difference between the first value C (=48=6'b110000) and the second value A (=8=6'b001000) is set as the first value C (=40=6'b101000), and a value corresponding to a half of the second value (A=8=6'b001000) is set as the second value A (=4=6'b000100). Since the second value A (=4=6'b000100) is not 1 in operation S60-4, operation S60-2 is performed again.

When it is determined in operation S60-2 that the frequency of the reference clock signal FREF is lower than the frequency of the feedback signal FFEED, operation S60-5 is re-performed.

A difference between the first value C (=40=6'b101000) and the second value A (=4=6'b000100) is set as the first value C (=36=6'b100100), and a value corresponding to a half of the second value A (=4=6'b000100) is set as the second value A (=2=6'b000010). Since the second value A (=2=6'b000010) is not 1 in operation S60-4, operation S60-2 is re-performed.

When it is determined in operation S60-2 that the frequency of the reference clock signal FREF is higher than the frequency of the feedback signal FFEED, operation S60-3 is re-performed. In operation S60-3, a sum of the first value C (=36=6'b100100) and the second value A (=2=6'b000010) is set as the first value C (=38=6'b100110), and a value corresponding to a half of the second value (A=2=6'b000010) is set as the second value A (=1=6'b00001).

According to the method described by referring to FIGS. 6 and 7, the AFC circuit 343 may sequentially set from the next bit of a most significant bit (MSB) of the first control code PVTC or the second control code COARSE to a least significant bit (LSB) thereof. Since the second value A (=1=6'b00001) is 1 in operation S60-4, the bits included in the first control code PVTC and/or the bits included in the second control code COARSE are determined to be 6'b100110.

As described above with reference to FIGS. 6 and 7, the AFC circuit 343 may compare the frequency of the reference clock signal FREF with that of the feedback signal FFEED, and generate the first control code PVTC and/or the second control code COARSE according to a result of the comparison.

Thus, by suitably designing the DCO 349 and the main divider 351, the ADPLL 200 may generate the feedback signal FFEED having a frequency that is approximate to the frequency of the reference clock signal FREF.

Referring back to FIG. 3, a lock detector 344 detects a level change of the comparison signal UP and generates the lock signal LD according to a result of the detection.

The lock detector 344 may determine whether the ADPLL 200 is locked or not, according to whether the comparison signal UP is toggled. For example, the lock detector 344 may generate the lock signal LD in a high level in a lock state, and generate the lock signal LD in a low level in an un-lock state. In other words, the lock detector 344 may detect whether the ADPLL 200 is locked or not, and output the lock signal LD according to a result of the detection.

The lock detector 344 may be reset in response to a decoder enable signal RC_EN and/or an AFC end signal AFC_END. The lock detector 344 will now be described in more detail by referring to FIGS. 8 through 10.

Figure 8:
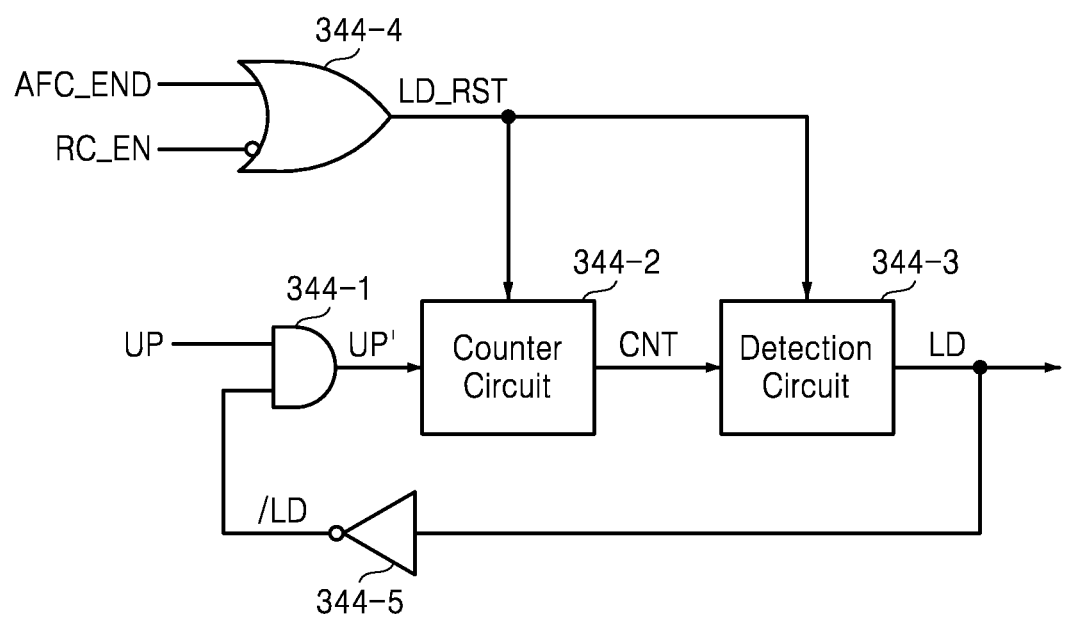
FIG. 8 is a block diagram of a lock detector illustrated in FIG. 3, according to an exemplary embodiment.

FIG. 8 is a block diagram of the lock detector 344 of FIG. 3. Referring to FIGS. 3 and 8, the lock detector 344 may include an AND gate 344-1, a counter circuit 344-2, a detection circuit 344-3, an OR gate 344-4 and an inverter 344-5.

The lock signal LD output from the detection circuit 344-3 is inverted by the inverter 344-5, and its inverted lock signal /LD may be input to the AND gate 344-1 together with the comparison signal UP output by the BBPFD 341. When the inverted lock signal /LD is in a high level, the AND gate 344-1 may provide the comparison signal UP as an input signal UP' of the counter circuit 344-2. In this case, when a delay occurring in the AND gate 344-1 is ignored, the comparison signal UP and the input signal UP' are substantially the same. In other words, when the ADPLL 200 is in an unlock state, the AND gate 344-1 may provide the comparison signal UP as the input signal UP' of the counter circuit 344-2.

The counter circuit 344-2 may count the number of times the input signal UP' is toggled, and output a count signal CNT according to a result of the counting.

The detection circuit 344-3 may detect whether the ADPLL 200 is locked based on the count signal CNT received from the counter circuit 344-2. The detection circuit 344-3 may generate the lock signal LD according to a result of the detection. For example, when the ADPLL is in a lock state, the detection circuit 344-3 may output the lock signal LD in a high level, and when the ADPLL is in an un-lock state, the detection circuit 344-3 may output the lock signal LD in a low level.

The OR gate 344-4 may perform an OR operation on the AFC end signal AFC_END received from the AFC circuit 343 and an inverted signal of the decoder enable signal RC_EN output by the monitor circuit 350, and output a lock detector reset signal LD_RST according to a result of the OR operation.

The counter circuit 344-2 and/or the detection circuit 344-3 may be reset in response to the lock detector reset signal LD_RST. According to an exemplary embodiment, when the AFC mode is ended and the AFC end signal AFC_END in a high level is input to the OR gate 344-4, the counter circuit 344-2 and/or the detection circuit 344-3 may be reset in response to the lock detector reset signal LD_RST. In other words, the lock detector 344 may operate after the AFC mode is ended, for example, when the AFC circuit 343 operates in a normal mode.

According to another exemplary embodiment, when the recorder enable signal RC_EN in a low level is input to the OR gate 344-4, the counter circuit 344-2 and/or the detection circuit 344-3 may be reset in response to the lock detector reset signal LD_RST. The decoder enable signal RC_EN may be a signal for enabling a row/column decoder 347-2. Since the row/column decoder 347-2 is enabled in the normal mode, the decoder enable signal RC_EN may have a low level in the AFC mode. In other words, the lock detector 344 may operate in the normal mode in response to the decoder enable signal RC_EN.

Figure 9:
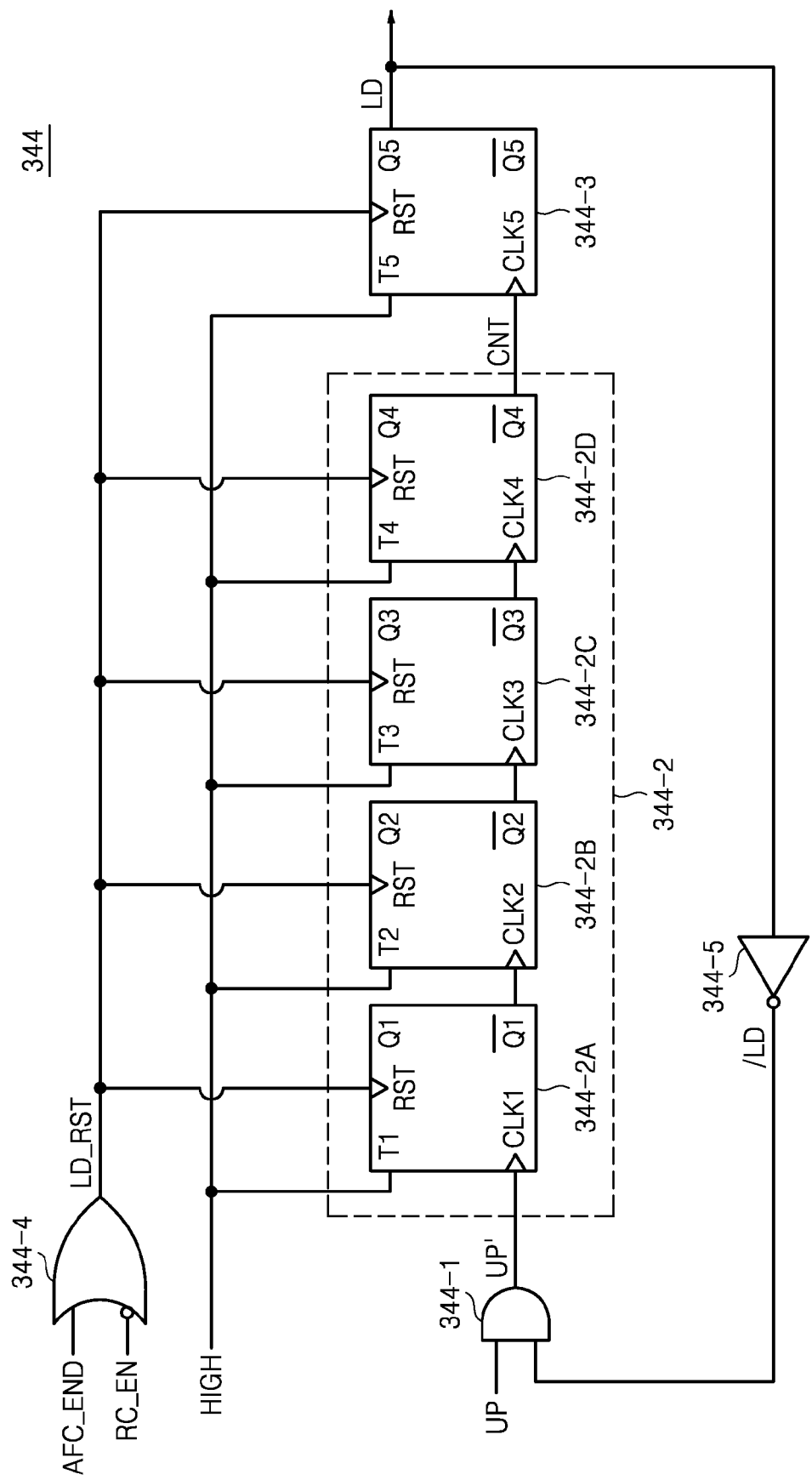
FIG. 9 is a circuit diagram of the lock detector illustrated in FIG. 8, according to an exemplary embodiment.
Figure 10:
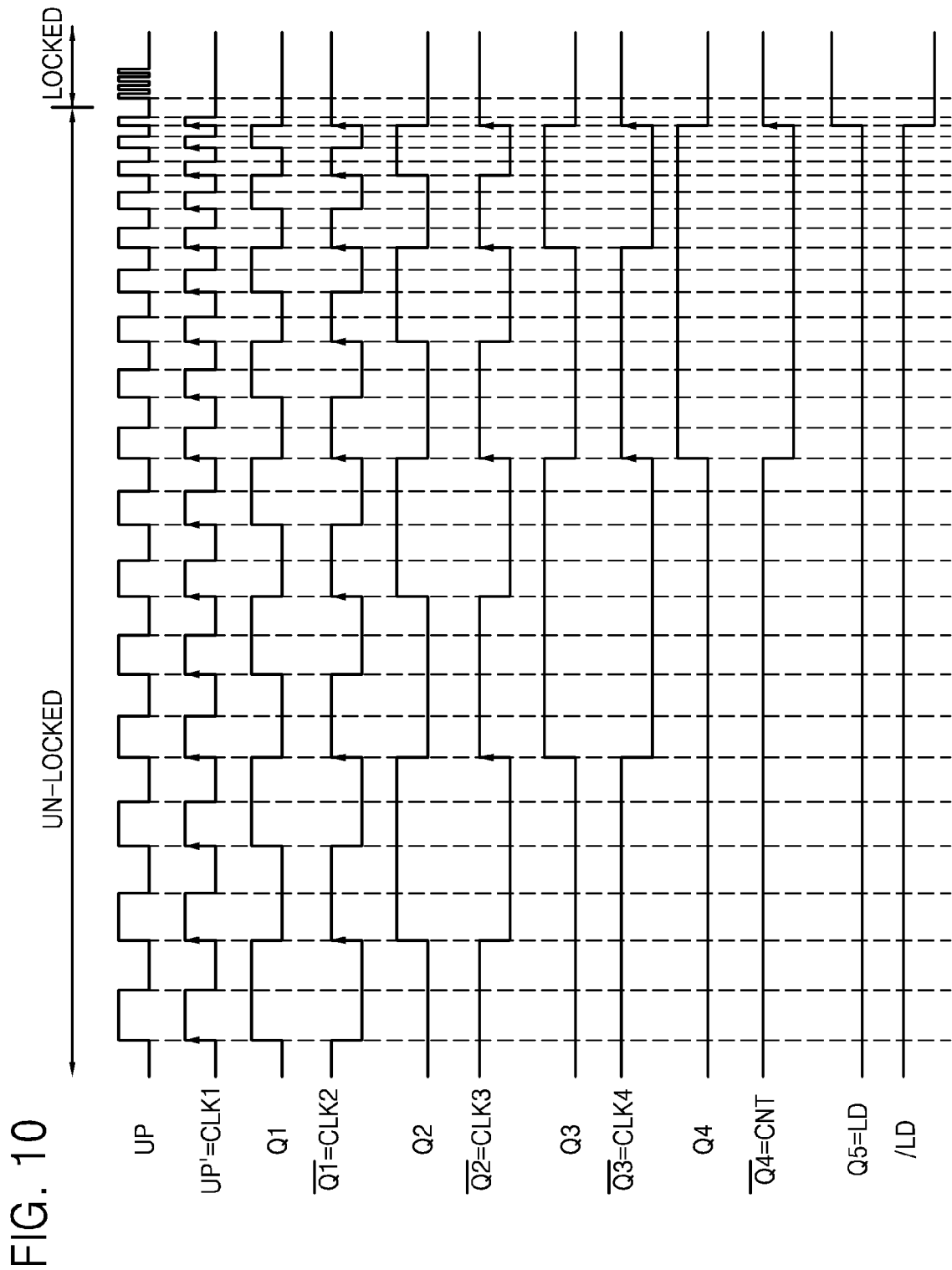
FIG. 10 is a timing diagram of signals illustrated in FIG. 9, according to an exemplary embodiment.

FIG. 9 is a circuit diagram of the lock detector 344 shown in FIG. 8, and FIG. 10 is a timing diagram of signals shown in FIG. 9. Referring to FIGS. 8 through 10, the counter circuit 344-2 may include a plurality of trigger (T) flip-flops, namely, first, second, third and fourth T flip-flops 344-2A through 344-2D, and the detection circuit 344-3 may be implemented by using a T-flip-flop.

While the inverted lock signal /LD has a high level, that is, while the ADPLL 200 is in an un-lock state, the AND gate 344-1 may output the comparison signal UP as the input signal UP'. The T-flip-flops 344-2A through 344-2D and the detection circuit 344-3 are supplied with high-level inputs via T-terminals T1 through T5, respectively. At this time, respective outputs of output terminals Q1 through Q5 and respective outputs of inverted output terminals /Q1 through /Q5 are toggled at edges (for example, rising edges or falling edges) of signals that are received via respective clock terminals CLK1 through CLK5 of the T-flip-flops 344-2A through 344-2D and the detection circuit 344-3.

In FIG. 10, it is assumed that the outputs of the output terminals Q1 through Q5 and the outputs of the inverted output terminals /Q1 through /Q5 are toggled, respectively, at the rising edges of the signals that are received via the clock terminals CLK1 through CLK5.

An output signal of the output terminal Q1 of the first T-flip-flop 344-2A is toggled at the rising edges of the input signal UP' that is received via the clock terminal CLK1. An output signal of the inverted output terminal /Q1 of the first T-flip-flop 344-2A is complementary to the output signal of the output terminal Q1. The output signal of the inverted output terminal /Q1 of the first T-flip-flop 344-2A is input to the clock terminal CLK2 of the second T-flip flop 344-2B.

An output signal of the output terminal Q2 of the second T-flip flop 344-2B is toggled at the rising edges of the output signal of the inverted output terminal /Q1 that is input to the clock terminal CLK2. An output signal of the inverted output terminal /Q2 of the second T-flip flop 344-2B is complementary to the output signal of the output terminal Q2 thereof. The output signal of the inverted output terminal /Q2 of the second T-flip flop 344-2B is input to the clock terminal CLK3 of the third T-flip flop 344-2C.

An output signal of the output terminal Q3 of the third T-flip flop 344-2C is toggled at the rising edges of the output signal of the inverted output terminal /Q2 that is input to the clock terminal CLK3. An output signal of the inverted output terminal /Q3 of the third T-flip flop 344-2C is complementary to the output signal of the output terminal Q3 thereof. The output signal of the inverted output terminal /Q3 of the third T-flip flop 344-2C is input to the clock terminal CLK4 of the fourth T-flip flop 344-2D.

An output signal of the output terminal Q4 of the fourth T-flip flop 344-2D is toggled at the rising edges of the output signal of the inverted output terminal /Q3 that is input to the clock terminal CLK4. An output signal of the inverted output terminal /Q4 of the fourth T-flip flop 344-2D is complementary to the output signal of the output terminal Q4 thereof. The output signal of the inverted output terminal /Q4 is input as the count signal CNT to the clock terminal CLK5 of the detection circuit 344-3.

The detection circuit 344-3 may output the lock signal LD in a high level via the output terminal Q5, at a rising edge of the count signal CNT, that is, at the point of time when a lock state is detected. In other words, when the number of times the comparison signal UP or the input signal UP' is the same as a reference number of times, the detection circuit 344-3 may determine that the ADPPL 200 enters a lock state.

FIGS. 9 and 10 illustrate a case where it is determined that the ADPLL 200 enters a lock state after the comparison signal UP or the input signal UP' is toggled sixteen times at rising edges. However, the reference number of times or the structure of the lock detector 344 may vary.

Referring back to FIG. 3, the integral circuit 345 generates an overflow/underflow signal OF/UF and a fraction code FRAC in response to the lock signal LD, the high gain enable signal HG, and the comparison signal UP. The integral circuit 345 will now be described in more detail by referring to FIG. 11.

Figure 11:
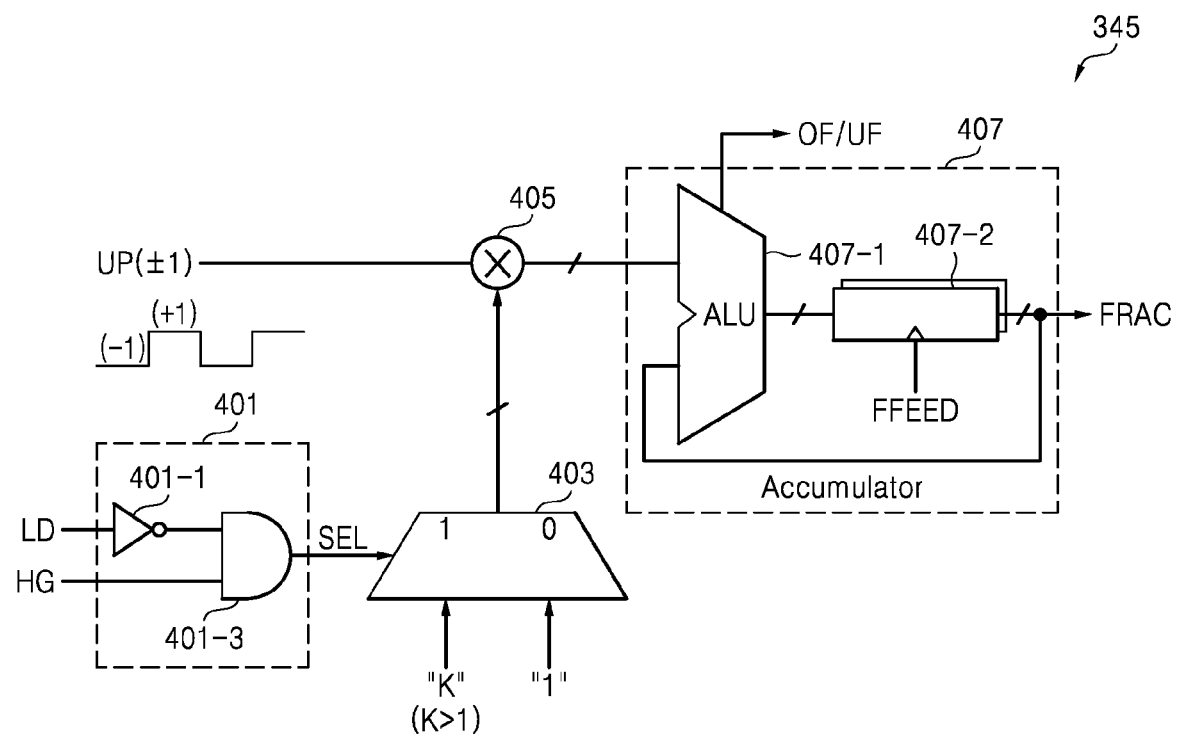
FIG. 11 is a circuit diagram of an integral circuit illustrated in FIG. 3, according to an exemplary embodiment.

FIG. 11 is a circuit diagram of the integral circuit 345 shown in FIG. 3. Referring to FIG. 11, the integral circuit 345 includes a selection signal generator 401, a selection circuit 403, a multiplier 405, and an accumulator 407.

The selection signal generator 401 generates a selection signal SEL in response to the lock signal LD and the high gain enable signal HG. The selection signal generator 401 includes an inverter 401-1 which receives the lock signal LD, and an AND gate 401-3 which performs an AND operation on an output signal of the inverter 401-1 and the high gain enable signal HG.

When the lock signal LD is in a low level and the high gain enable signal HG is in a high level, that is, when the ADPLL 200 is in an unlock state and a phase of the feedback signal FFEED transits within the search window SW, the selection signal generator 401 outputs the selection signal SEL in a high level. Thus, the selection circuit 403 outputs "K".

In the other cases, since the selection signal generator 401 outputs the selection signal SEL in a low level, the selection circuit 403 outputs "1".

The selection circuit 403 outputs "1" or "K" based on the selection signal SEL. Herein, "1" and/or "K" may be signals or bits capable of representing a binary integer.

The multiplier 405 multiplies the comparison signal UP by an output signal of the selection circuit 403. For example, when the comparison signal UP in a low level is expressed as "−1" and the comparison signal UP in a high level is expressed as "+1", the multiplier 405 may output "±1" or "±K" according to the output signal of the selection circuit 403.

The accumulator 407 accumulates a present input value and a previous input value in response to the feedback signal FFEED, and generates the overflow/underflow signal OF/UF and the fraction code FRAC according to a result of the accumulation. The accumulator 407 includes an arithmetic-logic unit (ALU) 407-1 and flip-flops 407-2 which operate in response to the feedback signal FFEED.

The ALU 407-1 may add output signals of the multiplier 405 to output signals of the flip-flops 407-2 in units of bits, and output a result of the addition to the flip-flops 407-2. The ALU 407-1 may also output the overflow signal OF or the underflow signal UF generated according to the result of the addition.

Referring back to FIG. 3, the fine control circuit 347, serving as a precision control code generation circuit, may precisely control the frequency of the feedback signal FFEED of the ADPLL 200 to a target frequency.

In the normal mode, the DCO 349 may control a total capacitance of capacitors that are associated with the closed-loop bandwidth of the ADPLL 200, based on the precision control codes. The precision control codes include the third control code PROP, the fourth control code FINE and the fifth control code DITHER.

The fine control circuit 347 includes a high gain demodulator (HGD) 347-1, the row/column decoder 347-2 and an accumulator 347-3 having a pseudo random number generator (PRNG).

The HGD 347-1 generates the third control code PROP in response to the comparison UP, the high gain enable signal HG and the lock signal LD. For example, when the lock signal LD is in a low level, the comparison signal UP is in a high level, and the high gain enable signal HG is in a high level, the HGD 347-1 increases the third control code PROP to a first change amount.

For example, when the lock signal LD is in a high level, the high gain enable signal HG is in a low level, and the comparison signal UP is in a high level, the HGD 347-1 increases the third control code PROP to a second change amount. The first change amount is greater than the second change amount.

For example, when the lock signal LD is in a low level, the comparison signal UP is in a low level, and the high gain enable signal HG is in a high level, the HGD 347-1 decreases the third control code PROP to a third change amount.

For example, when the lock signal LD is in a high level, the high gain enable signal HG is in a low level, and the comparison signal UP is in a low level, the HGD 347-1 decreases the third control code PROP to a fourth change amount. The third change amount is greater than the fourth change amount.

According to an exemplary embodiment, the first change amount and the third change amount may be the same, and the second change amount and the fourth change amount may be the same.

The row/column decoder 347-2 may generate the fourth control code FINE that increases in response to the overflow signal OF, and generate the fourth control code FINE that decreases in response to the underflow signal UF.

The row/column decoder 347-2 may be enabled or disabled in response to the decoder enable signal RC_EN output by the monitor circuit 350. For example, the row/column decoder 347-2 may be enabled in the normal mode or may be disabled in the AFC mode, in response to the decoder enable signal RC_EN.

The accumulator 347-3 with the PRNG generates the fifth control code DITHER in response to the fraction code FRAC.

The accumulator 347-3 with the PRNG randomizes the fraction code FRAC in response to a clock signal FAP output by the main divider 351, and generates the fifth control code DITHER, which is a result of the randomization.

A resolution of the frequency of each of the output clock signals DCOF1 and DCOF2 output by the DCO 349 may be improved according to the fifth control code DITHER, and a spurious tone in an accumulator (not shown) included in the accumulator 347-3 with the PRNG may be removed.

As for structure and an operation of the accumulator 347-3 with the PRNG, the contents described in Korean Patent Application No. 10-2012-0007129 (filed on Jan. 25, 2012, in the Korean Intellectual Property Office) or the contents described in U.S. patent application Ser. No. 13/737,337 (filed on Jan. 9, 2012, in USPTO) are included herein as a reference.

Figure 12:
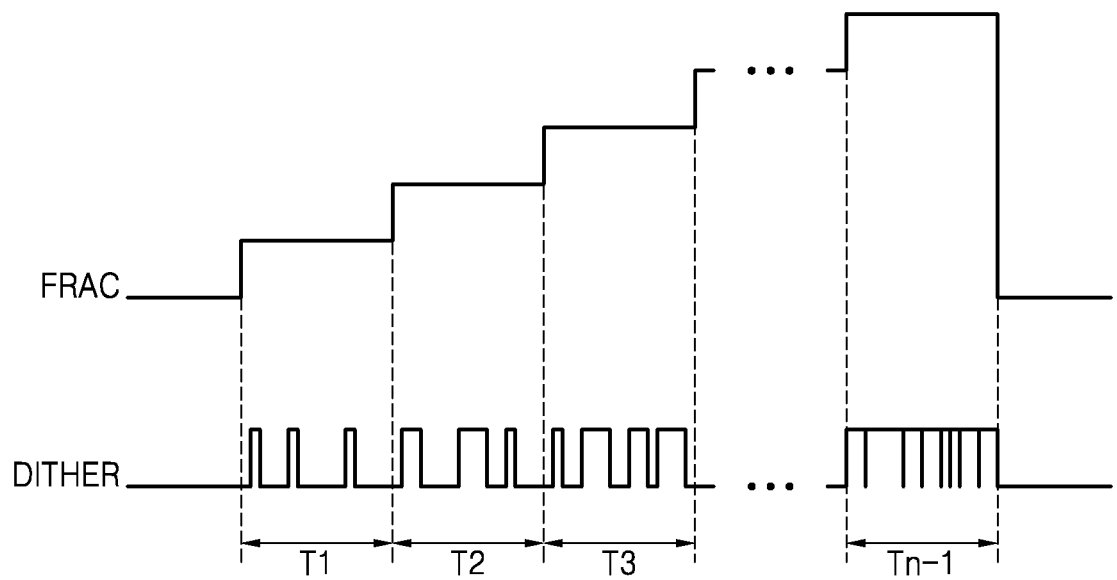
FIG. 12 is a conceptual diagram of an operation of an accumulator including a pseudo random number generator (PRNG) illustrated in FIG. 3, according to an exemplary embodiment.

FIG. 12 is a conceptual diagram for explaining an operation of the accumulator 347-3 with the PRNG of FIG. 3. First, for convenience of explanation, it is assumed that the fifth control code DITHER is one (1) bit. Referring to FIG. 12, as the fraction code FRAC increases, a sum of pulse widths of a signal that represents the fifth control code DITHER increases.

For example, when the fraction code FRAC is 5'b00000, the signal that represents the fifth control code DITHER is in a low level.

In a first section T1, when the fraction code FRAC is 5'b00001, the signal that represents the fifth control code DITHER includes at least one pulse, and a sum of the pulse width of the at least one pulse is 1/32 of a period. In a second section T2, when the fraction code FRAC is 5'b00010, the signal that represents the fifth control code DITHER includes at least one pulse, and a sum of the pulse width of the at least one pulse is 2/32 of a period.

In a third section T3, when the fraction code FRAC is 5'b00011, the signal that represents the fifth control code DITHER includes at least one pulse, and a sum of the pulse width of the at least one pulse is 3/32 of a period. In an (n−1)-th section Tn−1, when the fraction code FRAC is 5'b11111, the signal that represents the fifth control code DITHER includes at least one pulse, and a sum of the pulse width of the at least one pulse is 31/32 of a period.

In this case, it is assumed that the period is a number associated with the number of bits included in the fraction code FRAC, for example, the period is 32.

Figure 13:
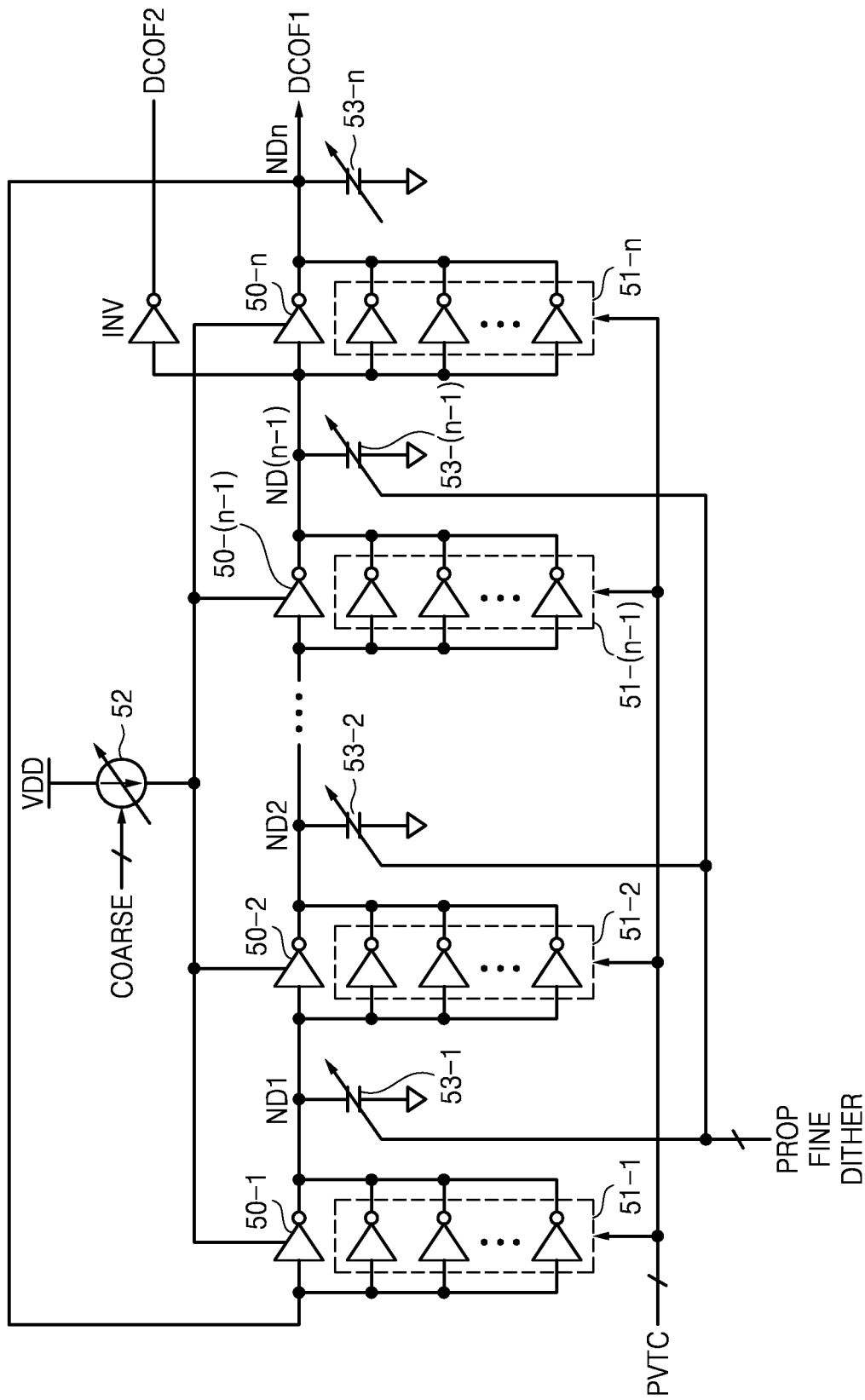
FIG. 13 is a circuit diagram of a digitally control oscillator illustrated in FIG. 3, according to an exemplary embodiment.

FIG. 13 is a circuit diagram of the DCO 349 of FIG. 3. Referring to FIGS. 3 and 13, the DCO 349 includes a plurality of inverters, namely, first through n-th inverters 50-1 through 50-n, (where n is a natural number) connected to one another in a ring shape, a plurality of inverter blocks, namely, first through n-th inverter blocks 51-1 through 51-n, a current source 52, and a plurality of capacitor bank arrays, first through n-th capacitor bank arrays 53-1 through 53-n.

The first through n-th inverter blocks 51-1 through 51-n are connected to the first through n-th inverters 50-1 through 50-n, respectively, in parallel. Each of the first through n-th inverter blocks 51-1 through 51-n may be referred to as a delay cell. Each of the first through n-th inverter blocks 51-1 through 51-n is enabled or disabled in response to at least one bit corresponding bit from among the bits included in the first control code PVTC.

Each of the first through n-th inverter blocks 51-1 through 51-n includes inverters connected in parallel. Since a driving capability increases with an increase in the number of inverters that are enabled, the respective frequencies of the output clock signals DCOF1 and DCOF2 of the DCO 349 increase.

The first inverter block 51-1 includes at least one inverter connected to the first inverter 50-1 in parallel, and the at least one inverter is enabled or disabled in response to at least one corresponding bit from among the bits included in the first control code PVTC.

The second inverter block 51-2 includes at least one inverter connected to the second inverter 50-2 in parallel, and the at least one inverter is enabled or disabled in response to at least one corresponding bit from among the bits included in the first control code PVTC. The n-th inverter block 51-n includes at least one inverter connected to the n-th inverter 50-n in parallel, and the at least one inverter is enabled or disabled in response to at least one corresponding bit from among the bits included in the first control code PVTC.

The respective frequencies of the output clock signals DCOF1 and DCOF2 of the DCO 349 may be controlled according to the number of inverters that are enabled from among the inverters included in each of the first through n-th inverter blocks 51-1 through 51-n.

The current source 52 may control a current amount that is supplied to the first through n-th inverters 50-1 through 50-n, in response to the second control code COARSE. According to the controlled current amount, the frequency of each of the output clock signals DCOF1 and DCOF2 that are generated by the DCO 349 may be controlled. The current amount is associated with a power supply voltage VDD. In other words, when the current amount supplied to the first through n-th inverters 50-1 through 50-n increases, the frequency of each of the output clock signals DCOF1 and DCOF2 increases.

The first through n-th capacitor bank arrays 53-1 through 53-n are connected to a plurality of nodes, first through n-th nodes ND1 through NDn, respectively. The capacitance of each of the first through n-th capacitor bank arrays 53-1 through 53-n may be controlled according to the third control code PROP, the fourth control code FINE and the fifth control code DITHER. Thus, the frequency of each of the output clock signals DCOF1 and DCOF2 of the DCO 349 may be controlled according to the controlled capacitances.

According to an exemplary embodiment, the first output clock signal DCOF1 of the DCO 349 may be associated with an output signal of one of the first through n-th inverters 50-1 through 50-n, for example, the last n-th inverter 50-n, and the second output clock signal DCOF2 of the DCO 349 may be associated with an output signal of another inverter, for example, an inverter INV. According to another exemplary embodiment, the first output clock signal DCOF1 and the second output clock signal DCOF2 may be the same signal.

Figure 14:
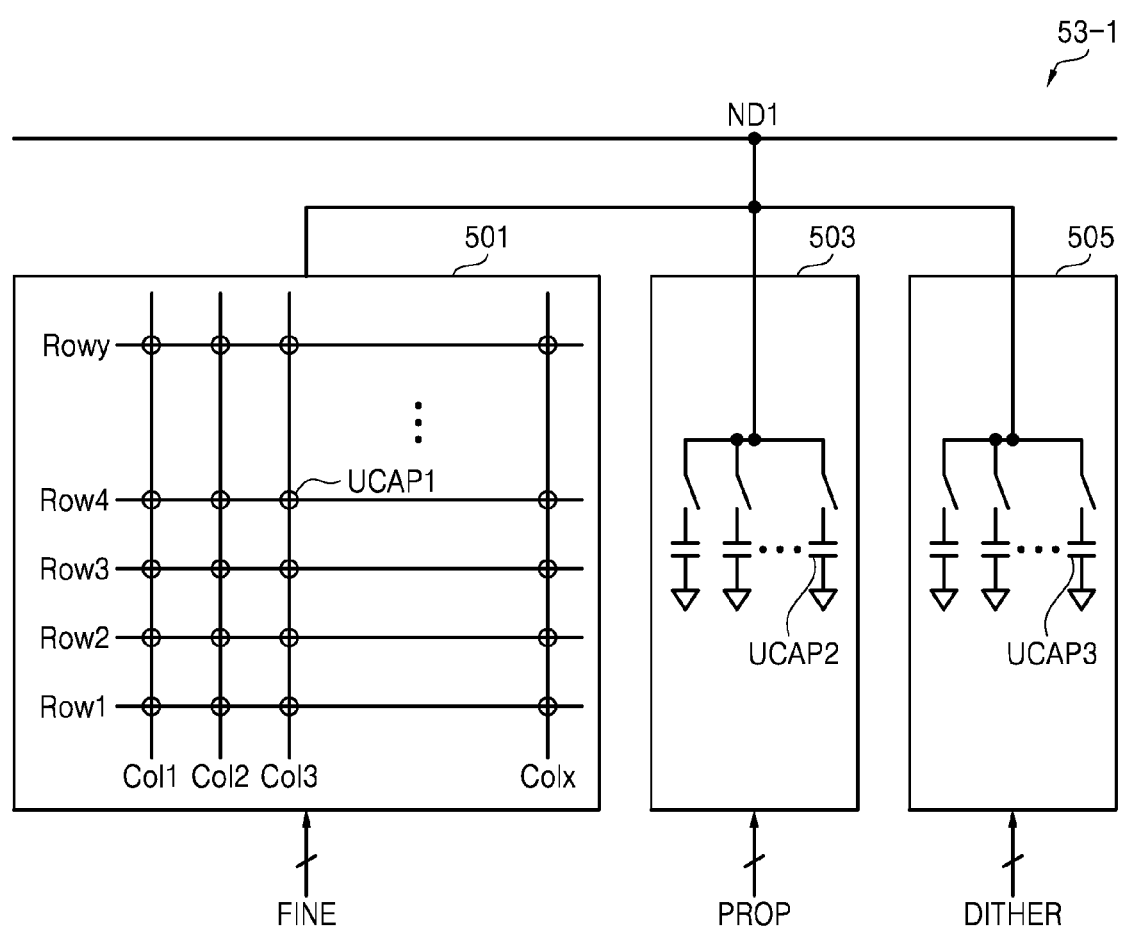
FIG. 14 is a conceptual diagram of an operation of a capacitor bank illustrated in FIG. 13, according to an exemplary embodiment.

FIG. 14 is a conceptual diagram for explaining an operation of the first capacitor bank array 53-1 illustrated in FIG. 13. Referring to FIGS. 3, 13, and 14, since the first through n-th capacitor bank arrays 53-1 through 53-n are substantially the same in their structure and operations, only the first capacitor bank array 53-1 will now be described for convenience of explanation.

The first capacitor bank array 53-1 includes a first capacitor array 501, a second capacitor array 503 and a third capacitor array 505. The first capacitor array 501 includes row lines ROW1 through ROWy, column lines COL1 through lines COLx and a plurality of first unit capacitors UCAP1, and each of the first unit capacitors UCAP1 is turned on/off according to the bits included in the fourth control code FINE.

Herein, "turned on" denotes an operation of increasing a total capacitance of the first capacitor array 501, and "turned off" denotes an operation of decreasing a total capacitance of the first capacitor array 501.

For example, every time when the overflow signal OF is received from the row/column decoder 347-2, the number of first capacitors UCAP1 that are turned on increases. Thus, since the total capacitance of the first capacitor array 501 increases, the frequency of each of the output clock signals DCOF1 and DCOF2 of the DCO 349 decreases.

On the other hand, every time when the underflow signal UF is received from the row/column decoder 347-2, the number of first capacitors UCAP1 that are turned off increases. Thus, since the total capacitance of the first capacitor array 501 decreases, the frequency of each of the output clock signals DCOF1 and DCOF2 of the DCO 349 increases.

According to an exemplary embodiment, the number of capacitors that are turned on may be determined by default.

The second capacitor bank array 503 includes a plurality of second unit capacitors UCAP2, and each of the second unit capacitors UCAP2 is turned on/off according to each of the bits included in the third control code PROP. For example, the third control code PROP may be implemented by using a thermometer code As described above, a variation of the third control code PROP may depend on whether the high gain enable signal HG is enabled and whether the lock signal LD is enabled.

For example, when the high gain enable signal HG is enabled to a high level and the lock signal LD is disabled to a low level, the number of second unit capacitors UCAP2 that are turned on or off at the same time according to a level of the comparison signal UP may be B1. On the other hand, when the high gain enable signal HG is disabled to a low level and the lock signal LD is enabled to a high level, the number of second unit capacitors UCAP2 that are turned on or off at the same time according to a level of the comparison signal UP may be B2. Here, B1 and B2 are natural numbers, and B1 is greater than B2.

The third capacitor array 505 includes at least one third unit capacitor UCAP3, and the third unit capacitor UCAP3 is turned on/off according to the fifth control code DITHER. The fifth control code DITHER may include one bit or a plurality of bits.

The main divider 351 is implemented by using a dual-modulus divider or a dual-modulus prescaler. For example, the main divider 351 may divide the first output clock signal DCOF1 of the DCO 349 by (N+1) or N to generate the clock signal FAP, and divide the clock signal FAP by P to generate the feedback signal FFEED. A divided-by-P clock signal, namely, the feedback signal FFEED, is divided by S, and a divided-by-S clock signal may be used as a selection signal for selecting division-by-(N+1) or division-by-N.

The output divider 353 may divide the second output clock signal DCOF2 of the DCO 349 by a frequency division factor to generate the output clock signal FOUT.

Figure 15:
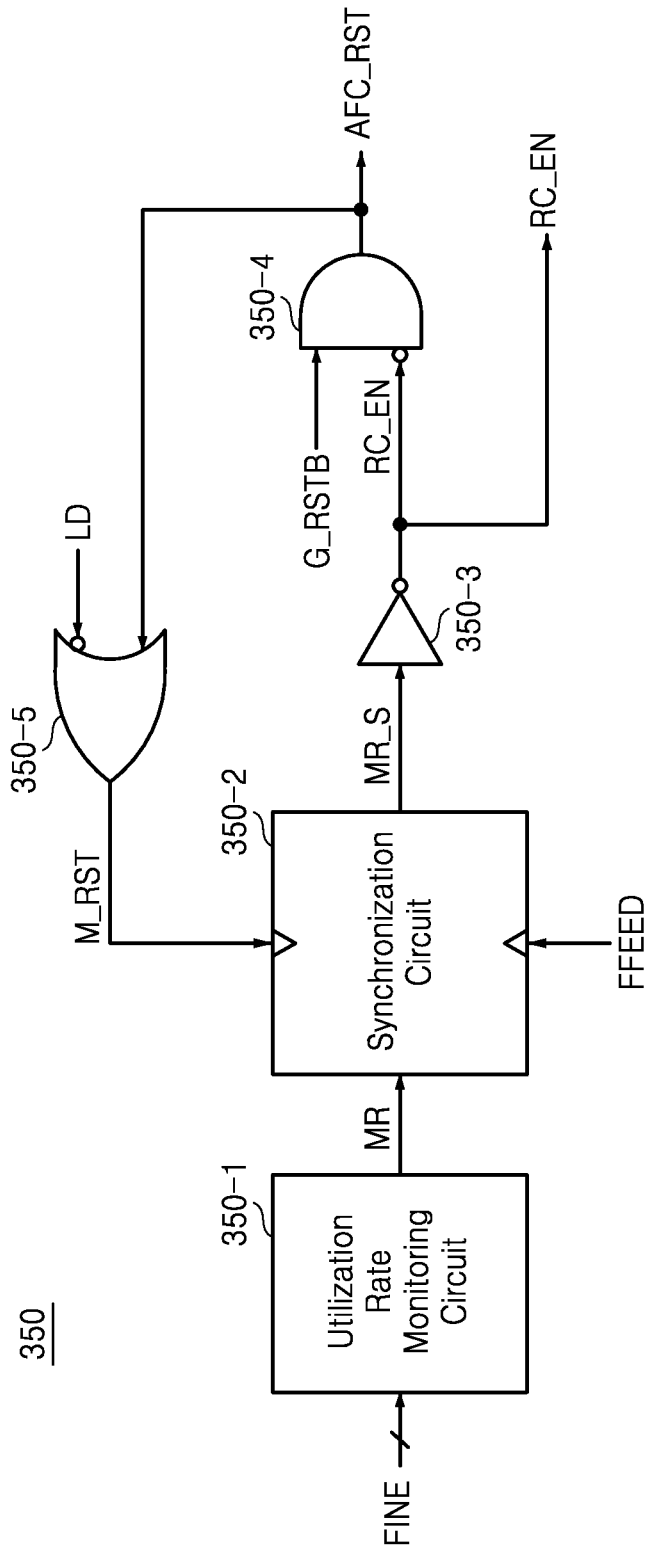
FIG. 15 is a block diagram of the monitor circuit illustrated in FIG. 3, according to an exemplary embodiment.

FIG. 15 is a block diagram of the monitor circuit 350 shown in FIG. 3. Referring to FIGS. 3, 14, and 15, the monitor circuit 350 may include a utilization rate monitoring circuit 350-1, a synchronization circuit 350-2, an inverter 350-3 and an AND gate 350-4.

The utilization rate monitoring circuit 350-1 may receive the fourth control code FINE, and output a monitoring result signal MR based on the received fourth control code FINE.

According to an exemplary embodiment, when an utilization rate of the first unit capacitors UCAP1 included in the first capacitor array 501 of the DCO 349, for example, the number of first unit capacitors UCAP1 that are turned on or off, deviates from a fixed range, the monitoring result signal MR may have a high level. According to another exemplary embodiment, when all of the first unit capacitors UCAP1 included in the first capacitor array 501 are turned on or off, the monitoring result signal MR may have a high level.

The synchronization circuit 350-2 may synchronize the monitoring result signal MR with the feedback signal FFEED to generate a synchronized monitoring result signal MR_S. The synchronization of the monitoring result signal MR with the feedback signal FEED by the synchronization circuit 350-2 is only an exemplary embodiment, and the inventive concept is not limited thereto.

According to an exemplary embodiment, the monitor circuit 350 may output a monitoring result signal MR that is synchronized with the feedback signal FFEED by the utilization rate monitoring circuit 350-1, without separately including the synchronization circuit 350-2.

The inverter 350-3 may invert the synchronized monitoring result signal MR_S, and output an inverted synchronized monitoring result signal as the decoder enable signal RC_EN. The AND gate 350-4 may perform an AND operation on an inverted signal of the decoder enable signal RC_EN output by the inverter 350-3 and a global reset signal G_RSTB, and output an AFC reset signal AFC_RST according to a result of the AND operation.

The global reset signal G_RSTB may denote a signal for initializing the ADPLL 200. According to an exemplary embodiment, the global reset signal G_RSTB may have a low level to initialize the ADPLL 200, and have a high level after the ADPLL 200 is initialized. The global reset signal G_RSTB may be received from an outside block (not shown) associated with the ADPLL 200.

According to an exemplary embodiment, when the utilization rate of the first unit capacitors UCAP1 included in the first capacitor array 501 deviates from the fixed range, the monitoring result signal MR and the synchronized monitoring result signal MR_S may each have a high level. In this case, the decoder enable signal RC_EN may have a low level, and the AFC reset signal AFC_RST may have a high level. The AFC circuit 343 may be reset in response to the AFC reset signal AFC_RST so that the AFC circuit 343 operates again. In other words, when the utilization rate of the first unit capacitors UCAP1 included in the first capacitor array 501 deviates from the fixed range, the mode of the ADPLL 200 may be changed from the normal mode to the AFC mode.

The OR gate 350-5 may perform an OR operation on an inverted signal of the lock signal LD and the AFC reset signal AFC_RST, and output a monitor reset signal M_RST according to a result of the OR operation.

According to an exemplary embodiment, when a lock state is not detected or the ADPLL 200 needs to operate in the AFC mode according to the result of the monitoring by the monitor circuit 350, the synchronization circuit 350-2 may be reset in response to the monitor reset signal M-RST in a high level.

For example, the case when the lock state is not detected may be the case when the lock signal LD is in a low level. For example, the case when the ADPLL 200 needs to operate in the AFC mode may be the case when the AFC reset signal AFC_RST is in a high level according to the PVT variation.

Figure 16:
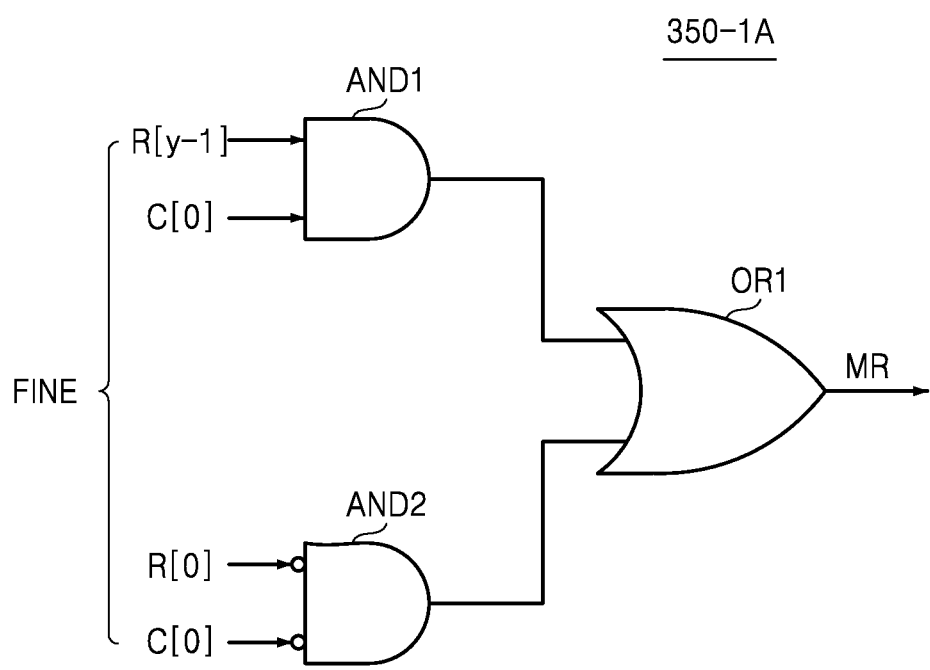
FIG. 16 is a circuit diagram of an utilization rate monitoring circuit illustrated in FIG. 15, according to an exemplary embodiment.

FIG. 16 is a circuit diagram of a utilization rate monitoring circuit 350-1A, which is an exemplary embodiment of the utilization rate monitoring circuit 350-1A shown in FIG. 15. Referring to FIGS. 14 through 16, the utilization rate monitoring circuit 350-1A may include a first AND gate AND1, a second AND gate AND2 and an OR gate OR1.

The first AND gate AND 1 may output an output signal in a high level, when all of the first unit capacitors UCAP1 included in the first capacitor array 501 are turned on.

For example, when both a control signal R[y−1] for turning on a (y−1)-th row line of the first capacitor array 501 and a control signal C[0] for turning on a zeroth column line of the first capacitor array 501 are in a high level, the first AND gate AND1 may output the output signal in a high level.

The second AND gate AND2 may output an output signal in a high level, when all of the first unit capacitors UCAP1 included in the first capacitor array 501 are turned off. For example, when both a control signal R[0] for turning on a zeroth row line of the first capacitor array 501 and the control signal C[0] for turning on the zeroth column line of the first capacitor array 501 are in a low level, the second AND gate AND2 may output an output signal in a high level.

The control signals R[y−1], R[0], and C[0] may correspond to a portion of the fourth control code FINE.

The OR gate OR1 may perform an OR operation on the output signal of the first AND gate AND1 and the output signal of the second AND gate AND2, and output the monitoring result signal MR according to a result of the OR operation. For example, the OR gate OR1 may output the monitoring result signal MR in a high level, when all of the first unit capacitors UCAP1 included in the first capacitor array 501 are turned on or off.

Figure 17:
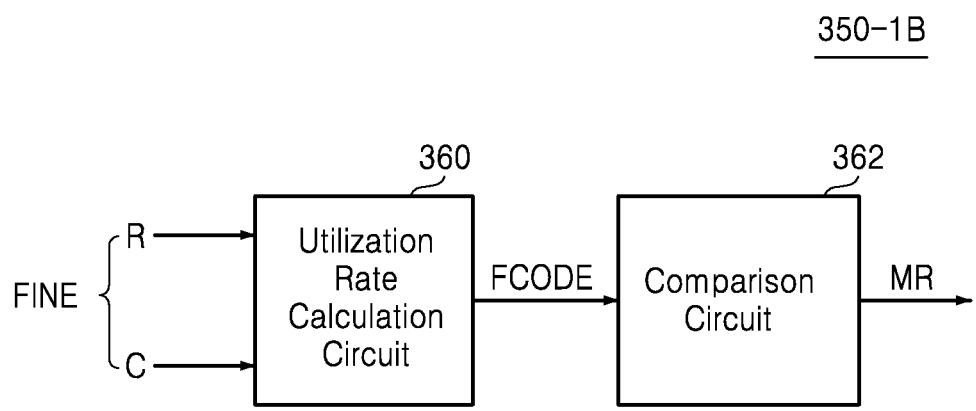
FIG. 17 is a circuit diagram of the utilization rate monitoring circuit illustrated in FIG. 15, according to an exemplary embodiment.

FIG. 17 is a circuit diagram of a utilization rate monitoring circuit 350-1B, which is another exemplary embodiment of the utilization rate monitoring circuit 350-1 shown in FIG. 15. Referring to FIGS. 14, 15, and 17, the utilization rate monitoring circuit 350-1B may include a utilization rate calculation circuit 360 and a comparison circuit 362.

The utilization rate calculation circuit 360 may calculate the number of first unit capacitors UCAP1 that are turned on or off, by using control signals R and C, and output a calculation result code FCODE according to a result of the calculation.

For example, the control signal R may denote a signal for turning on from the zeroth row line of the first capacitor array 501 to an R-th row line thereof. For example, the control signal C may denote a signal for turning on from the zeroth column line of the first capacitor array 501 to a C-th column line thereof. In this case, the utilization rate calculation circuit 360 may calculate the number of turned-on first unit capacitors UCAP1 to R*x+C, based on the control signals R and C.

The control signals R and C may correspond to a portion of the fourth control code FINE.

The comparison circuit 362 may compare the calculation result code FCODE output by the utilization rate calculation circuit 360 with each of a plurality of reference values, and output the monitoring result signal MR according to a result of the comparison.

According to an exemplary embodiment, the reference values may include an upper limit reference value and a lower limit reference value. When a capacitor utilization rate, namely, the calculation result code FCODE, is greater than the upper limit reference value or the capacitor utilization rate is smaller than the lower limit reference value, the comparison circuit 362 may output the monitoring result signal MR in a high level in order to convert the normal mode to the AFC mode.

Figure 18:
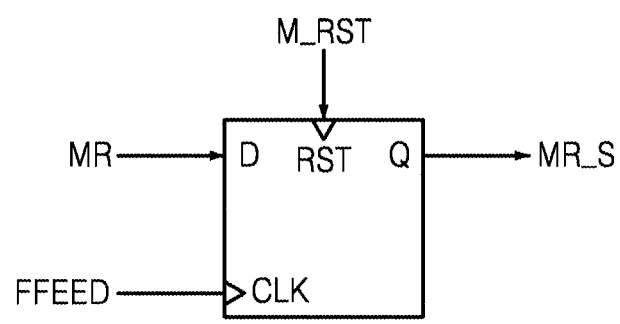
FIG. 18 is a block diagram of the synchronization circuit illustrated in FIG. 15, according to an exemplary embodiment.

FIG. 18 is a block diagram of the synchronization circuit 350-2 shown in FIG. 15. Referring to FIGS. 15 and 18, the synchronization circuit 350-2 may be implemented by using a D flip-flop.

The synchronization circuit 350-2 may synchronize the monitoring result signal MR, which is output by the utilization rate monitoring circuit 350-1, with the feedback signal FFEED to generate and output the synchronized monitoring result signal MR_S. The utilization rate monitoring circuit 350-1 may be reset according to the monitor reset signal M_RST.

Figure 19:
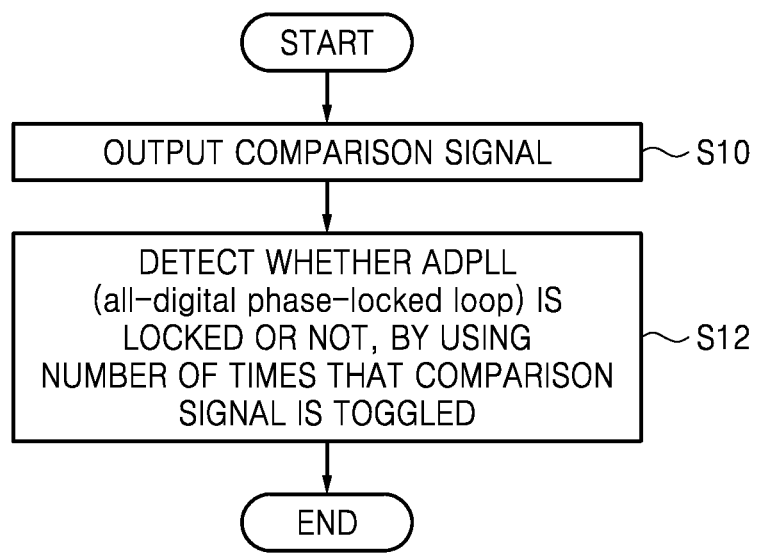
FIG. 19 is a flowchart of an operation of the ADPLL of FIG. 3, according to an exemplary embodiment.

FIG. 19 is a flowchart of an operation of the ADPLL 200 according to an exemplary embodiment of the inventive concept. Referring to FIGS. 3 and 19, the BBPFD 341 may compare a phase and a frequency of the reference clock signal FREF with those of the feedback signal FFEED, and output the comparison signal UP according to a result of the comparison, in operation S10. The lock detector 344 may detect whether the ADPLL 200 is locked or not, by using the number of times the comparison signal UP is toggled, in operation S12.

Figure 20:
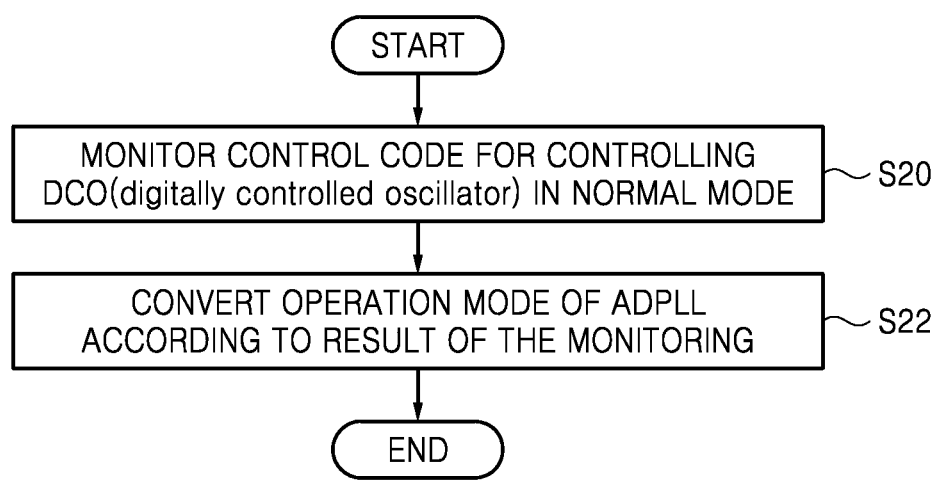
FIG. 20 a flowchart of an operation of the ADPLL of FIG. 3, according to an exemplary embodiment.

FIG. 20 is a flowchart of an operation of the ADPLL 200 according to another exemplary embodiment of the inventive concept. Referring to FIGS. 3 and 20, the monitor circuit 350 may monitor a control code (for example, the fourth control signal FINE) for controlling the DCO 349 in the normal mode, in operation S20.

The monitor circuit 350 may output the AFC reset signal AFC_RST and/or the decoder enable signal RC_EN according to a result of the monitoring, and an operation mode of the ADPLL 200 may be converted according to the AFC reset signal AFC_RST and/or the decoder enable signal RC_EN, in operation S22.

Figure 21:
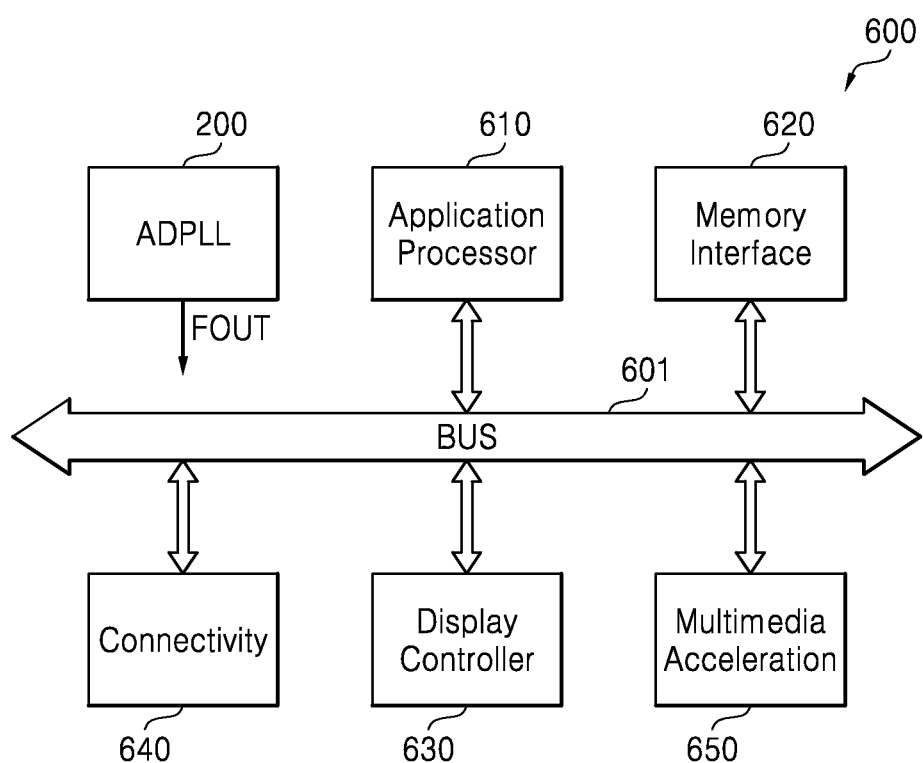
FIG. 21 is a block diagram of a portable electronic device including the ADPLL of FIG. 3, according to an exemplary embodiment.

FIG. 21 is a block diagram of a portable electronic device 600 including the ADPLL 200, according to an exemplary embodiment of the inventive concept. Referring to FIGS. 1 through 21, the portable electronic device 600 includes the ADPLL 200, an application processor AP 610, a memory interface 620, a display controller 630, connectivity 640, and a multimedia acceleration 650.

The portable electronic device 600 may be implemented by using a laptop computer, a cellular phone, a smart phone, a tablet PC, a personal digital assistant (PDA), an enterprise digital assistant (EDA), a digital still camera, a digital video camera, a portable multimedia player (PMP), a personal navigation device or a portable navigation device (PND), a handheld game console or an e-book.

The ADPLL 200 generates the feedback signal FFEED having a closed loop bandwidth that is adaptively controlled, and generates the output clock signals DCOF1 and DCOF2 by using the feedback signal FFEED.

The application processor 610 may control the memory interface 620, the display controller 630, the connectivity 640, and the multimedia acceleration 650 via a bus 601. The memory interface 620 may include an embedded memory device and a memory controller capable of interfacing with an outside memory device.

The display controller 630 may transmit, to a display, data that is to be displayed on the display. The connectivity 640 may include a general purpose input/output (GPIO) interface, a serial peripheral interface (SPI) bus and/or a universal serial bus (USB) on-the-go (USB OTG), etc.

The multimedia acceleration 650 may include a camera interface, a multi-format CODEC, a video pre-/post-processor, a JPEG and/or the like.

In a method and a device according to an exemplary embodiment of the inventive concept, an effective layout may be obtained by using a lock detector having a simple structure. Also, power consumption may be decreased by using the lock detector. Moreover, in the method and the device according to an exemplary embodiment of the inventive concept, a jitter value depending on the PVT variation may be monitored and compensated for.

While the inventive concept has been particularly shown and described with reference to exemplary embodiments thereof, it will be understood that various changes in form and details may be made therein without departing from the spirit and scope of the following claims.

What is claimed is:

1. A method operating a phase-locked loop (PLL), the method comprising:
   comparing a reference clock signal with a feedback signal of the PLL, and outputting a comparison signal according to a result of the comparison; and
   detecting whether the PLL is in a lock state according to a number of times the comparison signal is toggled,
   wherein the detecting comprises comparing the number of times the comparison signal is toggled with a reference number of times, and detecting whether the PLL is in the lock state, according to the result of the comparison.

2. The method of claim 1, wherein the detecting further comprises determining the number of times the comparison signal is toggled by counting a number of rising edges or falling edges of the comparison signal.

3. The method of claim 2, wherein the number of rising edges or falling edges of the comparison signal is counted after an auto frequency control mode is ended.

4. The method of claim 2, further comprising outputting a lock signal according to a result of the detecting whether the PLL is in the lock state.

5. The method of claim 4, wherein the determining the number of times the PLL is toggled comprises counting the number of rising edges or falling edges of the comparison signal based on the lock signal when the PLL is in an un-lock state.

6. The method of claim 4, further comprising controlling a closed-loop bandwidth of the PLL based on the lock signal.

7. The method of claim 1 further comprising:
   monitoring whether a mode conversion is needed, based on a control code for controlling a digitally control oscillator included in the PLL in a normal mode; and
   converting the normal mode into an automatic frequency control (AFC) mode according to a result of the monitoring.

8. The method of claim 7, wherein the control code is a code for controlling a total capacitance of a capacitor array associated with the closed-loop bandwidth of the PLL.

9. The method of claim 8, wherein the monitoring comprises monitoring whether all of the capacitors included in the capacitor array are turned on or off, based on the control code.

10. The method of claim 8, wherein the monitoring comprises:
    determining a capacitor utilization rate associated with the total capacitance, based on the control code; and
    comparing the determined capacitor utilization rate with each of a plurality of reference values, and monitoring whether the mode conversion is needed, according to a result of the comparison.

11. The method of claim 10, wherein the reference values comprise an upper limit reference value and a lower limit reference value.

12. The method of claim 11, wherein the converting the normal mode into the AFC mode comprises converting the normal mode into the AFC mode when the capacitor utilization rate is greater than the upper limit reference value or is smaller than the lower limit reference value.

13. The method of claim 7, further comprising:
    outputting a monitoring result signal according to a result of the monitoring; and
    synchronizing the monitoring result signal with a feedback signal of the PLL,
    wherein the converting the normal mode into the AFC mode comprises converting the normal mode into the AFC mode based on a synchronized monitoring result signal corresponding to a result of the synchronizing.

14. A phase-locked loop (PLL) comprising:
    a bangbang phase-frequency detector configured to compare a reference clock signal with a feedback signal of the PLL and output a comparison signal according to a result of the comparison; and
    a lock detector configured to detect whether the PLL is locked according to a number of times the comparison signal is toggled,
    wherein the lock detector is configured to detect whether the PLL is locked by comparing the number of times the comparison signal is toggled with a reference number of times.

15. The PLL of claim 14, wherein the lock detector comprises:
    a counter circuit configured to determine the number of times the comparison signal is toggled; and
    a detection circuit configured to detect whether the PLL is locked according to the number of times the comparison signal is toggled.

16. The PLL of claim 15, wherein the number of times the comparison signal is toggled is a number of rising edges or falling edges of the comparison signal.

17. A system on chip (SoC) comprises:
    the PLL of claim 14; and
    an application processor configured to operate in response to a clock signal associated with an output clock signal of the ADPPL.

18. A portable electronic device comprising:
    the SoC of claim 17; and
    a display that displays data processed by the application processor.

* * * * *